United States Patent
Kato et al.

(10) Patent No.: US 6,567,298 B2
(45) Date of Patent: May 20, 2003

(54) SEMICONDUCTOR MEMORY DEVICE AND CONTROL METHOD THEREOF

(75) Inventors: Yoshiharu Kato, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/983,148

(22) Filed: Oct. 23, 2001

(65) Prior Publication Data
US 2002/0141226 A1 Oct. 3, 2002

(30) Foreign Application Priority Data
Mar. 29, 2001 (JP) .......................... 2001-96380

(51) Int. Cl.⁷ .............................. G11C 11/24; G11C 7/02
(52) U.S. Cl. ...................... 365/149; 365/203; 365/206
(58) Field of Search .................. 365/149, 210, 365/203, 206, 222, 226

(56) References Cited

U.S. PATENT DOCUMENTS 5,337,270 A * 8/1994 Kawata et al. .............. 365/149
5,737,263 A * 4/1998 Takemae ..................... 365/149
6,233,187 B1 * 5/2001 Tsuchiya .................... 365/203

FOREIGN PATENT DOCUMENTS

JP   2000-215660   8/2000

* cited by examiner

Primary Examiner—Son Mai
(74) Attorney, Agent, or Firm—Arent Fox Kintner Plotkin & Kahn

(57) ABSTRACT

A semiconductor memory device, in which a cell plate potential does not fluctuate even when the device state is changed from a state without stored charge in all charge storage nodes of the cell capacitors at power-on to an access operation state, comprises NMOS transistors M1 to Mk for connecting a line VPR as a feeder for a reference voltage VPR from a reference voltage generation circuit with a line VCP as a feeder for a reference voltage VCP from the reference voltage generation circuit in each of cell blocks B1 to Bk. Gate terminals of the NMOS transistors M1 to Mk are connected to a common signal φCPR. The signal φCPR outputs a positive logical level at a predetermined time after power-on. By providing the NMOS transistors M1 to Mk for short-circuiting the line VPR with the line VCP in each of the cell blocks B1 to Bk, both lines are short-circuited in each of the cell blocks B1 to Bk.

28 Claims, 19 Drawing Sheets

SCHEMATIC DIAGRAM SHOWING THE EFFECT OF FIRST EMBODIMENT

FIG.2 SCHEMATIC DIAGRAM SHOWING THE EFFECT OF FIRST EMBODIMENT

FIG. 3 CIRCUIT BLOCK DIAGRAM SHOWING A SEMICONDUCTOR MEMORY DEVICE ACCORDING TO SECOND EMBODIMENT

FIG. 4 CIRCUIT BLOCK DIAGRAM SHOWING A SEMICONDUCTOR MEMORY DEVICE ACCORDING TO THIRD EMBODIMENT

FIG. 5 WAVEFORM DIAGRAM SHOWING THE OPERATION OF THE SEMICONDUCTOR MEMORY DEVICE ACCORDING TO THIRD EMBODIMENT

CIRCUIT DIAGRAM SHOWING THE OPERATION OF THE SEMICONDUCTOR MEMORY DEVICE ACCORDING TO THIRD EMBODIMENT

FIG. 9 WAVEFORM DIAGRAM SHOWING THE OPERATION OF THE SEMICONDUCTOR MEMORY DEVICE ACCORDING TO FOURTH EMBODIMENT

FIG. 10 CIRCUIT BLOCK DIAGRAM SHOWING A SEMICONDUCTOR MEMORY DEVICE ACCORDING TO FIFTH EMBODIMENT

FIG. 11 WAVEFORM DIAGRAM SHOWING THE OPERATION OF THE SEMICONDUCTOR MEMORY DEVICE ACCORDING TO FIFTH EMBODIMENT

FIG. 12 CIRCUIT BLOCK DIAGRAM SHOWING A SEMICONDUCTOR MEMORY DEVICE ACCORDING TO SIXTH EMBODIMENT

WAVEFORM DIAGRAM SHOWING THE OPERATION OF THE SEMICONDUCTOR MEMORY DEVICE ACCORDING TO SIXTH EMBODIMENT

FIG. 14 CIRCUIT BLOCK DIAGRAM SHOWING A SEMICONDUCTOR MEMORY DEVICE ACCORDING TO SEVENTH EMBODIMENT

CIRCUIT BLOCK DIAGRAM SHOWING A SEMICONDUCTOR MEMORY DEVICE ACCORDING TO CONVENTIONAL ART

CIRCUIT DIAGRAM SHOWING A REFERENCE VOLTAGE GENERATION CIRCUIT

CIRCUIT DIAGRAM SHOWING A MEMORY CELL PAIR CONNECTED TO A BIT LINE PAIR

CROSS SECTION VIEW OF A MEMORY CELL

WAVEFORM DIAGRAM SHOWING THE OPERATION OF THE SEMICONDUCTOR MEMORY DEVICE ACCORDING TO THE CONVENTIONAL ART

SEMICONDUCTOR MEMORY DEVICE AND CONTROL METHOD THEREOF

BACKGROUND OF THE INVENTION

1. Field of the Invention

The invention relates to data storage in memory cells in a semiconductor memory device, and more particularly to charge retention in a semiconductor memory device which has cell capacitors for storing charge in memory cells and stores data by storing charge.

2. Description of Related Art

A random access memory (hereinafter referred to as a "DRAM") has been conventionally used as a typical example of a memory device which has a cell capacitor for storing charge in a memory cell. FIG. 15 is a circuit block diagram showing a DRAM 1000 as an example of a semiconductor memory device according to a conventional art. A semiconductor memory device such as the DRAM 1000 is configured such that memory cells C00 to Cnm arranged in a matrix shape are divided into multiple cell blocks B1 to Bk. Each of the cell blocks B1 to Bk has a similar configuration. Hereinafter, the cell block B1 will be described as an example of the cell block. Word lines WL0 to WLn for selecting the memory cells C00 to Cnm by each line address are connected to the memory cells C00 to Cnm. Stored charge in the selected memory cells C00 to Cnm is read out onto bit lines BL0, /BL0 to BLm, /BLm as data transfer passages. The bit lines BL0, /BL0 to BLm, /BLm are connected to sense amplifier circuits (not illustrated) provided in a sense amplifier group 102 and the read-out stored charge is differentially amplified on a bit line pair. In a recent large-capacity DRAM 1000, sense amplifier circuits are generally configured between a ground potential GND and a power supply Viic whose voltage is stepped down by an internal step-down power supply.

The memory cells C00 to Cnm corresponding to the bit line pairs BL0 and /BL0 to BLm and /BLm are paired to constitute a memory cell unit U (see FIG. 17). Each of the bit line pairs BL0 and /BL0 to BLm and /BLm is provided with a sense amplifier circuit. Drivers for driving the word lines WL0 to WLn are configured for each row address as a word driver group 101.

The stored charge retained by the memory cells C00 to Cnm selected by the word lines WL0 to WLn is read out onto the bit lines BL0 to /BLm, and is differentially amplified and read out as data by the sense amplifier circuits, or the stored charge in the memory cells C00 to Cnm is refreshed. Consequently, it is necessary to reset (hereinafter referred to as "equalize") the bit line pairs BL0 and /BL0 to BLm and /BLm at each access cycle in preparation for the next access. Therefore, the bit line pairs are equalized by a bit line equalization group 106 at the end of access (hereinafter referred to as "at the time of pre-charge").

At the time of equalization, all bit lines BL0 to /BLm belonging to the cell block B1 are short-circuited with each other by a transistor (not illustrated) provided in the bit line equalization group 106. Then, the bit lines are equalized to a reference voltage VPR by a reference voltage generation circuit 104. The bit line pairs which are differentially amplified by the internal step-down voltage Viic are equalized. Therefore, the voltage of the bit lines becomes Viic/2 and the reference voltage VPR is also set at Viic/2. Since many bit lines BL0 to /BLm exist in the cell block B1, the sum of the parasitic capacitances of all bit lines at the time of equalization has a significant capacitance value. The sum of the parasitic capacitances of all bit lines at the time of equalization is shown as the bit line equalization capacitance CPR in FIG. 15.

On the other hand, the potential of a cell plate CP1 for cell capacitors (C0, C1 in FIG. 17) for storing charge in the memory cells C00 to Cnm is also biased to the reference voltage VCP by the reference voltage generation circuit 104. Since the differentially amplified voltage is the voltage Viic also at this location, the reference voltage VCP is generally set at Viic/2 to minimize an electric field applied to the cell capacitors C0, C1. In other words, the reference voltage output from the reference voltage generation circuit 104 is Viic/2. Since the cell plate CP1 is common to all memory cells C00 to Cnm belonging to the cell block B1, the parasitic capacitance has a significant capacitance value. The sum of the parasitic capacitances is shown as the cell plate parasitic capacitance CCP in FIG. 15.

The reference voltages VPR, VCP are supplied to each of the cell blocks B1 to Bk by lines VPR, VCP through NMOS transistors MPR, MCP. In the large-capacity DRAM 1000, the area where the cell blocks B1 to Bk are arranged is large. Therefore, the total wiring length of each of the feeders (the lines VPR, VCP) are large and parasitic resistances RPR0 to RPRk, RCP0 to RCPk exist on the wiring paths.

The lines VPR, VCP are separated from the reference voltage generation circuit 104 by control signals φPR, φCP supplied to the NMOS transistors MPR, MCP. A bias can be externally applied through test pads PCP, PPR.

In addition, the recent large-capacity DRAM or the like is sometimes configured such that dummy capacitors DC00 to DC1m are interposed between dummy word lines DWL0, DWL1 and the bit lines BL0 to /BLm. Owing to this configuration, the dummy word lines DWL0, DWL1 are simultaneously driven by a dummy word driver group 103 at the time of access and charge is supplied supplementarily to the bit lines BL0 to /BLm by using the capacitive coupling effect by the dummy capacitors DC00 to DC1m, thereby improving the margin of stored charge read out from the memory cells C00 to Cnm. An operation for improving the read-out characteristics with regard to information "1" is called assist 1, and an operation for improving the read-out characteristics with regard to information "0" is called assist 0.

An example of a reference voltage generation circuit 104 is shown in FIG. 16. The reference voltage generation circuit 104 is constituted by a reference voltage generation portion 104B and a reference voltage drive portion 104D. In the reference voltage generation portion 104B, the source terminal of a diode-connection type NMOS transistor M7 connected to power supply voltage VDD through a PMOS transistor M6, and the source terminal of a diode-connection type PMOS transistor M8 connected to a ground potential GND through an NMOS transistor M9 are connected with each other. Owing to this configuration, the drain terminals of the transistors M7, M8 output a constant bias voltage independently of the power supply voltage VDD. This bias voltage is input to the gate terminals of an NMOS transistor M10 and a PMOS transistor M11 constituting the reference voltage drive portion 104D. A connection is made between the source terminals of the transistors M10, M11 to constitute an output terminal. Each of the transistors M10, M11 functions as a source follower to keep the voltage of the output terminal at a reference voltage. Resistance devices R1, R2 may be connected to the output terminal as compensating devices.

FIG. 17 shows the memory cell unit U (see FIG. 15). The memory cell unit U is composed of a pair of memory cells C00, C10. In each of the memory cells C00, C10, cell capacitors C0, C1 are connected to bit lines BL0, /BL0 through NMOS transistors M0, M1 controlled by word lines WL0, WL1. In general, the NMOS transistors M0, M1 are called transfer gates. Stored charge is given and received via the NMOS transistors M0, M1 as the transfer gates between charge storage nodes ST0, ST1 which are terminals on one side of the cell capacitors C0, C1 and the bit lines BL0, /BL0 to store data. The terminals on the other side of the cell capacitors C0, C1 are connected to a common cell plate CP1, and the potential of the cell plate CP1 is biased to the reference voltage VCP by the reference voltage generation circuit 104. Since the potential of the cell plate CP1 is the reference voltage for storing charge in the cell capacitors C0, C1, it is a common potential within the cell block B1, and a significant parasitic capacitance value CCP0 is added. The sum of the parasitic capacitances of all cell blocks B1 to Bk is the cell plate parasitic capacitance CCP shown in FIG. 15.

FIG. 18 is the cross section view of a memory cell C00. Although all memory cells have the same cross section structure, reference numerals are given to the memory cell C00 as an example in FIG. 18. The drain terminal of an NMOS transistor M0 controlled by a word line WL0 is stored charge ST0. The stored charge ST0 constitutes one terminal of a cell capacitor C0. The cell capacitor C0 is configured by arranging a cell plate CP1 via a dielectric film 17. The cell plate CP1 extends rightward and is configured so as to be common to all cell capacitors in the cell block B1 via a cell plate CP1 of a neighbor memory cell. The cell plate CP1 is protected by a PSG film 19 as an upper interlayer film, and is formed on a nitride film 15 between the memory cells. Since a parasitic capacitance component exists between these interlayer films 15, 19, a parasitic capacitance CCP0 is added to the cell plate CP1, and the sum of the parasitic capacitances in the entire DRAM 1000 becomes the cell plate parasitic capacitance CCP.

Each access operation in reading, writing, and refreshing data is performed in the same manner till a differential amplification operation by the sense amplifier circuits. In other words, the storage nodes of the memory cells C00 to Cnm selected by the word lines WL0 to WLn corresponding to row addresses are connected to the bit lines BL0 to /BLm. The stored charge which is read out becomes minute charge on a bit line pair, and is differentially amplified by the sense amplifier circuits. Data is read out or refreshed by the differential amplification. (with regard to a writing operation, data is forced to be inverted by external writing after the differential amplification.) At this point, the potential of the storage nodes ST0, ST1 of the cell capacitors C0, C1 is sharply fluctuated twice. The first potential fluctuation occurs when the storage nodes ST0, ST1 are connected to the bit lines BL0 to /BLm. Since the bit line capacitance is larger than the cell capacitor capacitance, the stored charge is redistributed when the storage nodes are connected to the bit lines, and the potential of the storage nodes ST0, ST1 is changed from the approximately ground potential GND or the internal step-down voltage Viic to around a bit line equalization voltage VPR (approximately Viic/2). This change is transmitted to the cell plate CP1 through the cell capacitors C0, C1 by capacitive coupling, and the charge is distributed according to the parasitic capacitance of the cell plate CP1 to fluctuate the cell plate potential VCP. However, when the sense amplifier circuits are started and the differential amplification is performed, the bit line potential is restored from Viic/2 to GND or Viic. This potential fluctuation similarly causes the fluctuation in the cell plate potential VCP by the capacitive coupling to the cell plate CP1. These potential fluctuations transmitted by the capacitive coupling are opposite to each other, and are applied in pairs. As a result, the cell plate potential VCP is not fluctuated.

However, there is no stored charge at power-on. In all cell capacitors, no stored charge, or if any, very little stored charge exists. The access operation at this point may cause a problem described in detail below.

The power supply voltage VDD is increased after power-on as shown in FIG. 19. As the power supply voltage VDD is increased, the reference voltage generation circuit 104 starts its operation and the bit line potential VPR and the cell plate potential VCP are increased to Viic/2. At this point, charge is injected from the cell plate potential VCP to the storage nodes ST0, ST1 constituting the cell capacitors C0, C1 by capacitive coupling. Since the injected charge is redistributed to the combined capacitance and gate capacitance of the storage nodes ST0, ST1, the potential VST of the storage nodes ST0, ST1 becomes slightly lower than Viic/2.

When an access operation such as a refresh operation is performed under this condition, the word line WL is activated and the storage nodes ST0, ST1 are connected to the bit lines BL0 to /BLm. At this point, the bit line potential has been equalized to VPR (that is, Viic/2) and almost equals to the potential VST of the storage nodes ST0, ST1, with little charge transferred. Therefore, the storage nodes ST0, ST1 are retained at almost the same potential. When the dummy word line DWL is activated, charge is injected to the bit lines BL0 to /BLm through the dummy capacitors DC00 to DC1m by capacitive coupling. Accordingly, the potential VST of the storage nodes ST0, ST1 becomes slightly higher than Viic/2. When the sense amplifier circuits are started in this potential relationship, the potential VST of the storage nodes ST0, ST1 is increased to the internal step-down voltage Viic level. Owing to this increase in the potential, charge is supplied to the cell plate CP1 through the cell capacitors C0, C1 by capacitive coupling, and the cell plate potential VCP is increased. In a configuration where the dummy word line DWL does not exist, the bit lines BL0 to /BLm are restored to the ground potential GND, and the cell plate potential VCP becomes negative due to capacitive coupling (the detailed description in this regard is omitted). If the directions of the potentials become opposite, an operation similar to the operation described below is performed, and a similar problem arises. The following description relates to the case the cell plate potential VCP is increased when the dummy word line DWL exists.

If the word lines WL0 to WLn are sequentially selected and the above-mentioned operations are repeated before the cell plate potential VCP is restored, the cell plate potential VCP may be increased due to capacitive coupling every time the sense amplifier circuits are activated, and finally it may reach the internal step-down voltage Viic level. The more memory cells among the memory cells C00 to Cnm are restored at one operation, the more noticeably this phenomenon occurs. The typical example is a refresh operation in which more word lines among the word lines WL0 to WLn are selected compared to a normal access operation. Under the circumstances where the capacity of a memory device becomes larger though the capacitance of a cell capacitor cannot be increased, the number of the memory cells among the memory cells C00 to Cnm selected at one operation is increased to maintain a refresh cycle. Therefore, the above-mentioned phenomenon may occur more noticeably as the capacity of a memory device becomes larger in the future. However, the cause of the phenomenon is not limited to the increase in the capacity of a memory device. When each capacitance component depending on the configuration of architecture such as addressing or process technology is distributed in a certain way, the phenomenon may not occur even if the capacity of the memory device is increased. To the contrary, this phenomenon may occur during a normal access operation.

When this phenomenon occurs in the presence of the memory cells C00 to Cnm where the data "0" is written immediately after power-on, charge is supplied also to the storage nodes ST0, ST1 where the data "0" is written from the cell plate CP1 by capacitive coupling as the potential of the cell plate CP1 is increased. Therefore, the potential VST of the storage nodes is increased. When this potential exceeds Viic/2, there arises a problem such as that the data "0" cannot be read out from the memory cells C00 to Cnm, and the data is garbled.

When data 1 is written in the memory cells C00 to Cnm under the condition that the potential of the cell plate CP1 is increased, there may arise a problem that the data disappears because sufficient positive charge is not stored in the charge storage nodes ST0, ST1.

In addition, the cell plate potential VCP may be increased to the internal step-down voltage Viic at the highest. When the data "0" is written after the cell plate potential VCP reaches the internal step-down voltage Viic, excessive electric field stress is applied to the dielectric film 17 (see FIG. 18) between the terminals of the cell capacitors C0, C1. Therefore, there arises a problem that the reliability of the device is adversely affected.

In order to avoid this condition, it is necessary that the reference voltage generation circuit 104 should absorb the charge supplied by capacitive coupling. Therefore, it is conceivable to make the driving capability of the reference voltage generation circuit 104 sufficiently large. However, this measure cannot be realized, because the current consumption in the reference voltage generation circuit 104 is increased and thus the measure contradicts to the demand for a low current consumption operation. In addition, the size of the circuit should be made large. Thus, the measure is difficult to realize also because of the restriction of the chip area.

Since the capacity of a memory device becomes large and thus the number of the arranged memory cells C00 to Cnm becomes large, the area where the cell blocks B1 to Bk are arranged becomes large as described above. The total wiring length of the line VCP becomes large, and the parasitic resistances RCP0 to RCPk on the wiring path are combined with the cell plate parasitic capacitance CCP to form a delay circuit. Therefore, the absorption of the charge generated by capacitive coupling is inhibited despite the increased driving capability of the reference voltage generation circuit 104.

SUMMARY OF THE INVENTION

In view of the above-mentioned problems of the conventional arts, it is an object of the invention to provide a semiconductor memory device for storing data by storing charge, comprising cell capacitors for storing charge in memory cells, wherein a cell plate potential is not fluctuated even when the device state is changed from a state in which no stored charge, or if any, very little stored charge exists in all charge storage nodes of the cell capacitors at power-on to an access operation state.

In order to achieve the above-mentioned object, a semiconductor memory device according to one aspect of the invention is configured to comprise a plurality of storage cells for storing data by storing charge in capacitive elements, a first terminal of each of the capacitive elements being connected to a common reference terminal, and the charge being stored by being injected into and released from a second terminal of each of the capacitive elements; and potential fluctuation suppression capacitive elements connected to the reference terminal, for suppressing a potential fluctuation associated with the charge injected from each of the capacitive elements by capacitive coupling when the charge is injected into and released from the second terminal of each of the capacitive elements.

A control method of a semiconductor memory device according to one aspect of the invention for achieving the above-mentioned object is a control method of the semiconductor memory device comprising a plurality of storage cells for storing data by storing charge in capacitive elements, a first terminal of each of the capacitive elements being connected to a common reference terminal, and the charge being stored by being injected into and released from a second terminal of each of the capacitive elements. In the control method, potential fluctuation suppression capacitive elements are connected to the reference terminal in order to suppress a potential fluctuation associated with the charge injected from each of the capacitive elements by capacitive coupling when the charge is injected into and released from the second terminal of each of the capacitive elements.

According to this method, a potential fluctuation at the reference terminal can be suppressed due to the presence of the potential fluctuation suppression capacitive elements, even if charge is transferred from the second terminals of the capacitive elements to the reference terminal by capacitive coupling when the charge is injected to or released from the capacitive elements in the storage cells where no charge is stored and neither data 0 nor data 1 exists.

The potential fluctuation suppression capacitive elements described here can be fixedly connected to the reference terminal. In this case, a potential fluctuation at the reference terminal can be suppressed without requiring controls such as connecting the potential fluctuation suppression capacitive elements to the reference terminal only for a predetermined time period after power-on.

A semiconductor memory device according to another aspect of the invention is configured to comprise a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements, a plurality of data lines provided in each group of a predetermined number of the storage cells as paths for injecting and releasing charge into and from the second terminal of each of the capacitive elements, a first wiring line for supplying a reference voltage to each of the data lines, a second wiring line for supplying a reference voltage to the reference terminal, wiring line connection switch elements for connecting the first wiring line with the second wiring line, and a power supply detection circuit for the input of a power supply voltage, wherein the wiring line connection switch elements are brought into conduction to electrically connect the first wiring line with the second wiring line during a predetermined time period after the detection by the power supply detection circuit.

In this semiconductor memory device, reference voltage is supplied to a plurality of data lines and reference terminals to both of which a predetermined number of memory cells are connected via the first and second wiring lines. The wiring line connection switch element connects the first wiring line with the second wiring line based on a signal from the power supply detection circuit.

Furthermore, there is provided a control method of a semiconductor memory device according to another aspect of the invention, the memory device comprising a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements, wherein the input of a power supply voltage is detected, and a first wiring line for supplying a reference voltage to a plurality of data lines provided in each group of a predetermined number of the storage cells with a second wiring line for supplying the reference voltage to the reference terminal.

The first wiring line and the second wiring line are connected so as to reduce wiring-line resistance toward the reference terminals. Accordingly, drivability of a reference voltage generating circuit can be fully used and charges that move due to capacity coupling can be effectively absorbed, whereby potential fluctuation of the reference terminal can be suppressed.

Furthermore, connection between the first wiring line and the second wiring line can be restricted to time to supply power. The first wiring line and the second wiring line are separated from each other so that these wiring lines can eliminate mutual interference due to noises or the like, keeping their individuality, and different level voltages can be applied to the wiring lines for test, which are effects conventionally obtained. That is, keeping the effects conventionally obtained, the semiconductor memory device can suppress voltage fluctuation of the reference terminal which is likely to occur when power is supplied.

Written data can be effectively prevented from being garbled or disappearing at power-on, and excessive electric field stress is not applied to a dielectric film between the terminals of the capacitive elements. Further, and an operation causing a problem regarding reliability does not arise. In addition, since the driving capability of the reference voltage generation circuit does not need to be made larger than necessary to realize these effects, an increase in the current consumption and a burden due to an increase in the chip area occupied by the reference voltage generation circuit can be minimized.

A semiconductor memory device according to a third aspect of the invention is configured to comprise a plurality of storage cells for storing data by storing charge in capacitive elements, a first terminal of each of the capacitive elements being connected to a common reference terminal, and the charge being stored by being injected into and released from a second terminal of each of the capacitive elements; a reference voltage generation portion for generating a reference voltage value signal to be supplied to the reference terminal; and a plurality of reference voltage drive portions arranged in each group of a predetermined number of storage cells of the plurality of storage cells, for receiving the reference voltage value signal and supplying the reference voltage to the reference terminal corresponding to each group of the predetermined number of storage cells.

In the semiconductor memory device, the reference voltage drive portions arranged in each group of the predetermined number of storage cells of the plurality of storage cells supply the reference voltage to the corresponding reference terminal. The reference voltage output from the reference voltage drive portions is set according to the reference voltage value signal generated by the reference voltage generation portion.

According to this device, the reference voltage generation circuit is configured so as to be divided into one reference voltage generation portion and a plurality of reference voltage drive portions. The reference voltage value signal connected from the reference voltage generation portion to the reference voltage drive portions is a voltage bias signal, and thus the input impedance can be set at a high value. In addition, no large potential difference occurs even if long wiring lines are routed. Therefore, the reference voltage drive portions can be arranged in the vicinity of the reference terminal to be driven. Since there is no load such as a wiring line resistance or a wiring line capacitance between the reference voltage drive portions and the reference terminal, the potential at the reference terminal can be effectively retained and a potential fluctuation at the reference terminal can be suppressed.

In addition, since each of the reference voltage drive portions needs to drive only the reference terminal corresponding to each group of the predetermined number of storage cells, the load to be driven can be made small and the driving capability of the reference voltage drive portion can be made small. Therefore, the chip area occupied by the reference voltage drive portions can be minimized by setting the circuit size of the reference voltage drive portion so as to be small.

A semiconductor memory device according to a fourth aspect of the invention is configured to comprise a plurality of storage cells for storing data by storing charge in capacitive elements, a first terminal of each of the capacitive elements being connected to a common reference terminal, and the charge being stored by being injected into and released from a second terminal of each of the capacitive elements; and a power supply detection circuit for detecting the input of a power supply voltage. In the semiconductor memory device, the number of the storage cells having the second terminals of the capacitive elements into which charge is injected based on a signal from the power supply detection circuit and the number of the storage cells having the second terminals of the capacitive elements from which charge is released are the same.

A control method of a semiconductor memory device according to a third aspect of the invention for achieving the above-mentioned object is a control method of the semiconductor memory device comprising a plurality of storage cells for storing data by storing charge in capacitive elements, a first terminal of each of the capacitive elements being connected to a common reference terminal, and the charge being stored by being injected into and released from a second terminal of each of the capacitive elements. In the control method, the input of a power supply voltage is detected, charge is injected into the second terminal of each of the capacitive elements in a predetermined number of storage cells, and charge is released from the second terminal of each of the capacitive elements in the same number of other storage cells.

According to this method, the storage cells into which charge is injected and the storage cells from which charge is released are paired. Therefore, the amount of the charge supplied to the reference terminal through the capacitive elements by capacitive coupling is cancelled, and a potential fluctuation at the reference terminal can be suppressed.

If this operation of canceling the amount of the transferred charge is performed in each cell block which includes a predetermined number of storage cells as a unit, the amount of the transferred charge can be effectively cancelled because the storage cells into which charge is injected and the storage cells from which charge is released are arranged relatively close to each other.

A semiconductor memory device according to a fifth aspect of the invention is configured to comprise a plurality of storage cells for storing data by storing charge in capacitive elements, a first terminal of each of the capacitive elements being connected to a common reference terminal, and the charge being stored by being injected into and released from a second terminal of each of the capacitive elements; a plurality of data lines arranged in each group of a predetermined number of storage cells as paths for injecting and releasing charge into and from the second terminal of each of the capacitive elements; a first wiring line for supplying a reference voltage to each of the data lines; a second wiring line for supplying the reference voltage to the reference terminal; a clamp switch element provided between the first wiring line or the second wiring line and a predetermined voltage; a plurality of selection lines for electrically connecting each of the data lines with the second terminal of each of the capacitive elements; and a power supply detection circuit for detecting the input of a power supply voltage. In the semiconductor memory device, the first wiring line or the second wiring line is fixed at a predetermined voltage by controlling the clamp switch element based on a signal from the power supply detection circuit, and the second terminal of each of the capacitive elements is set at a preset voltage by selecting a predetermined number of selection lines. In addition, a predetermined number of selection lines are deselected, the predetermined potential is subsequently separated from the first wiring line or the second wiring line by controlling the clamp switch element, and the reference voltage is supplied.

In a control method of the semiconductor memory device according to a fourth aspect of the invention, the first or the second wiring line is fixed at a predetermined voltage based on a signal from the power supply detection circuit, a predetermined number of selection lines for electrically connecting a plurality of data lines to which a predetermined number of storage cells are connected with each of the capacitive elements are selected, and a second terminal of each of the capacitive elements is set at a preset voltage. Then, the predetermined number of selection lines are deselected, the predetermined potential is separated from the first or the second wiring line, and the reference voltage is supplied.

According to this method, the second terminals of a predetermined number of capacitive elements can be placed in a charge storage state as a data written state, only by selecting a predetermined number of selection lines in the case where the first wiring line is fixed at a predetermined voltage. The transition to this state does not require performing a differential amplification operation using sense amplifier circuits or other operations. In addition, a predetermined number of selection lines can be selected in one cycle, and the transition operation can be performed in a short time. Therefore, it is possible to secure sufficient time for ceasing the potential fluctuation at the reference terminal associated with the injection and release of charge into and from the second terminals of the capacitive elements.

In addition, in the case where the second wiring line is fixed at a predetermined voltage, when the second wiring line is separated from the predetermined voltage and the voltage of the second wiring line is changed to a normal voltage after the second terminals of a predetermined number of capacitive elements are placed in a charge storage state at a reference voltage level by selecting a predetermined number of selection lines, the second terminals of the capacitive elements can be placed in a charge storage state as a data written state through the capacitive elements by capacitive coupling. The transition to this charge storage state is performed by using capacitive coupling through the capacitive elements when the potential of the reference terminal is changed from the predetermined voltage at which the second wiring line is fixed to the normal voltage. Therefore, the charge transfer associated with the capacitive coupling does not induce a potential fluctuation at the second terminals of the capacitive elements or the reference terminal. Furthermore, the charge transfer is used to inject and release charge into and from the second terminals of the capacitive elements, and has an effect of assisting data writing.

In both cases, it is not necessary to perform a differential amplification operation using sense amplifier circuits or other operations. In addition, a predetermined number of selection lines can be selected in one cycle, and the data writing can be completed in a short time. In order to perform the operation of selecting the selection lines, existing circuits can be effectively used, and furthermore circuits such as a test circuit can be used as they are.

A semiconductor memory device according to a sixth aspect of the invention is configured to comprise a plurality of storage cells for storing data by storing charge in capacitive elements, a first terminal of each of the capacitive elements in the plurality of storage cells being connected to a common reference terminal, and the charge being stored by being injected into and released from a second terminal of each of the capacitive elements; a plurality of data lines arranged in each group of a predetermined number of storage cells as paths for injecting and releasing charge into and from the second terminal of each of the capacitive elements; a first wiring line for supplying a reference voltage to each of the data lines; a second wiring line for supplying the reference voltage to the reference terminal; a first and a second clamp switch elements provided between the first and the second wiring lines, and a predetermined voltage; a plurality of selection lines for electrically connecting each of the data lines with the second terminal of each of the capacitive elements; and a power supply detection circuit for detecting the input of a power supply voltage. In the semiconductor memory device, the first and the second wiring lines are fixed at a predetermined voltage by controlling the first and the second clamp switch elements based on a signal from the power supply detection circuit, and the second terminal of each of the capacitive elements is set at a preset voltage by selecting a predetermined number of selection lines. In addition, the predetermined potential is separated from the second wiring line by controlling the second clamp switch element, and the reference voltage is supplied. Furthermore, the predetermined number of selection lines are deselected, the predetermined potential is subsequently separated from the first wiring line by controlling the first clamp switch element, and the reference voltage is supplied.

In a control method of the semiconductor memory device according to a fifth aspect of the invention, the first and the second wiring lines are fixed at a predetermined voltage based on a signal from a power supply detection circuit, a predetermined number of selection lines for electrically connecting a plurality of data lines to which a predetermined number of storage cells are connected with each of the capacitive elements are selected, and a second terminal of each of capacitive elements is set at a preset voltage. Then, the predetermined voltage is separated from the second wiring line, and a reference voltage is supplied. Furthermore, a predetermined number of selection lines are deselected, the predetermined potential is separated from the first wiring line, and the reference voltage is supplied.

A semiconductor memory device according to a seventh aspect of the invention is configured to comprise a plurality of storage cells for storing data by storing charge in capacitive elements, a first terminal of each of the capacitive elements being connected to a common reference terminal, and the charge being stored by being injected into and released from a second terminal of each of the capacitive elements; a refresh control circuit for self-refreshing the stored charge; and a power supply detection circuit for detecting the input of a power supply voltage. In the semiconductor memory device, the refresh control circuit is started based on a signal from the power supply detection circuit.

In a control method of the semiconductor memory device according to the sixth aspect of the invention, the input of a power supply voltage is detected, and a refresh operation is performed.

According to this method, a predetermined number of storage cells perform a refresh operation due to a self-refresh operation performed by the refresh control circuit, and thus the second terminal of each of the capacitive elements can be placed in a charge storage state by data writing.

The above and further objects and novel features of the invention will more fully appear from following detailed description when the same is read in connection with the accompanying drawings. It is to be expressly understood, however, that the drawings are for the purpose of illustration only and are not intended as a definition of the limits of the invention.

DETAILED DESCRIPTION OF PREFERRED EMBODIMENTS

Hereinafter, semiconductor memory devices and control methods thereof according to a first embodiment to a seventh embodiment of the invention will be described in detail with reference to the drawings.

Figure 1:
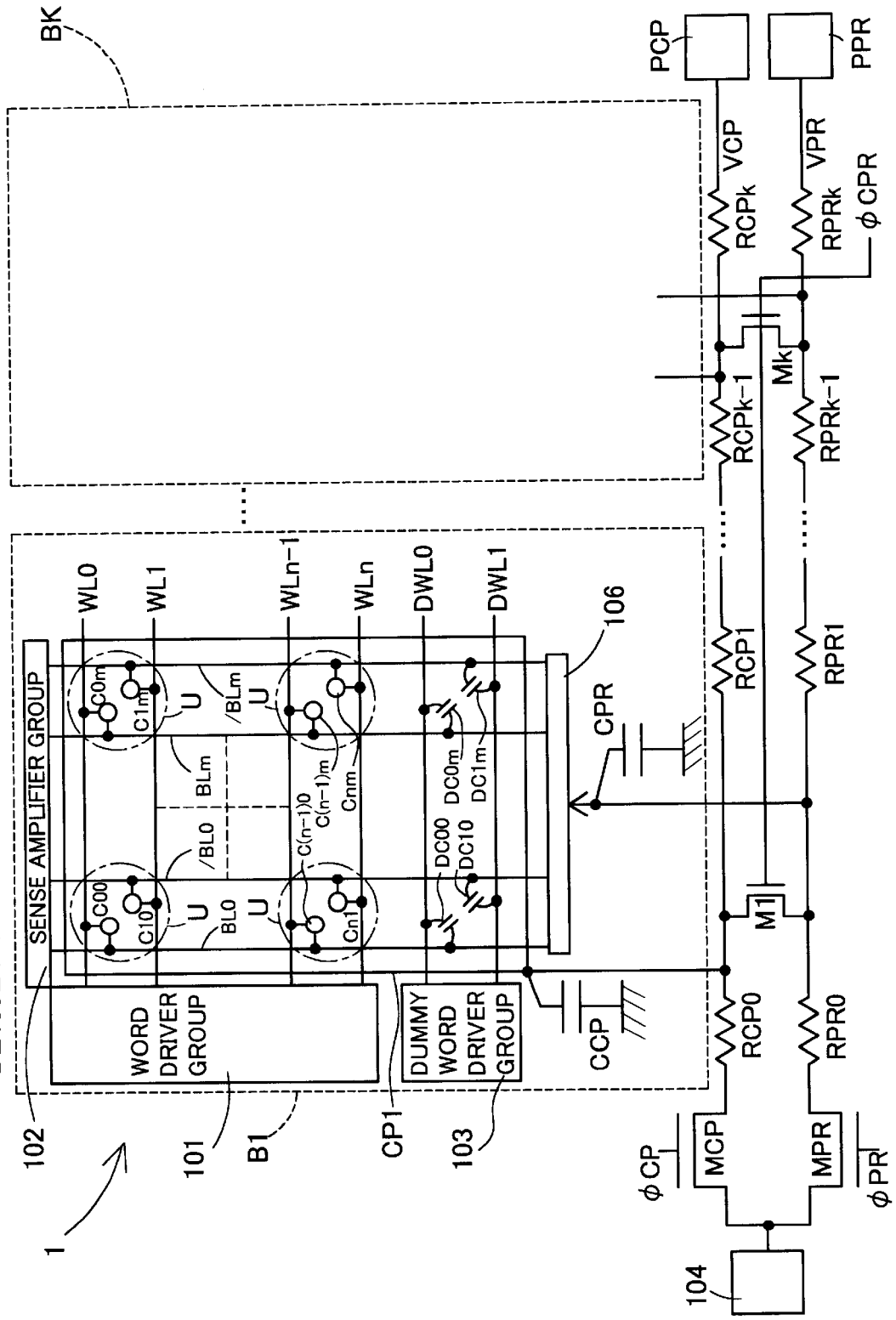
FIG. 1 is a circuit block diagram showing a semiconductor memory device according to a first embodiment.
Figure 15:
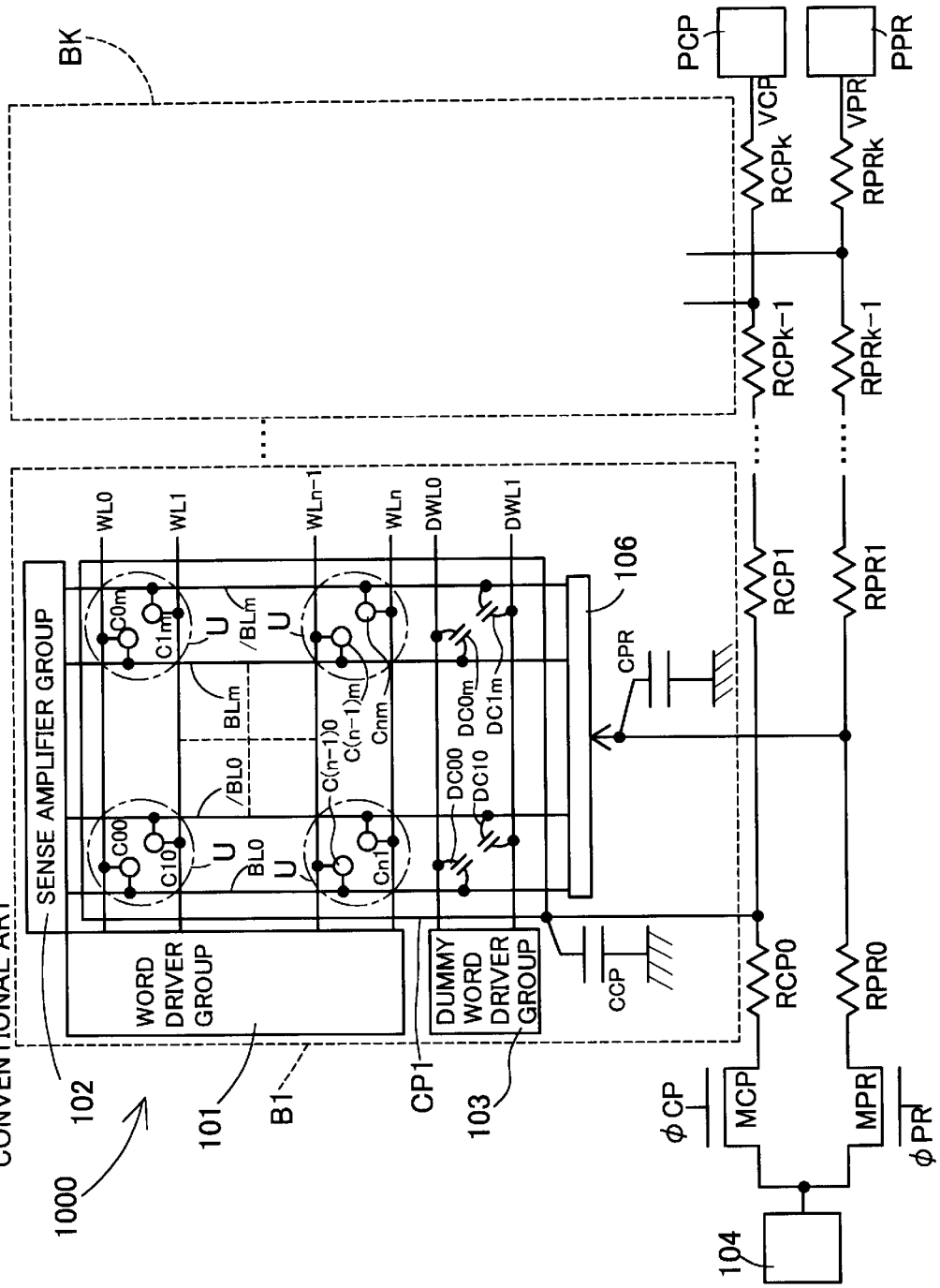
FIG. 15 is a circuit block diagram showing a semiconductor memory device according to a conventional art.
Figure 16:
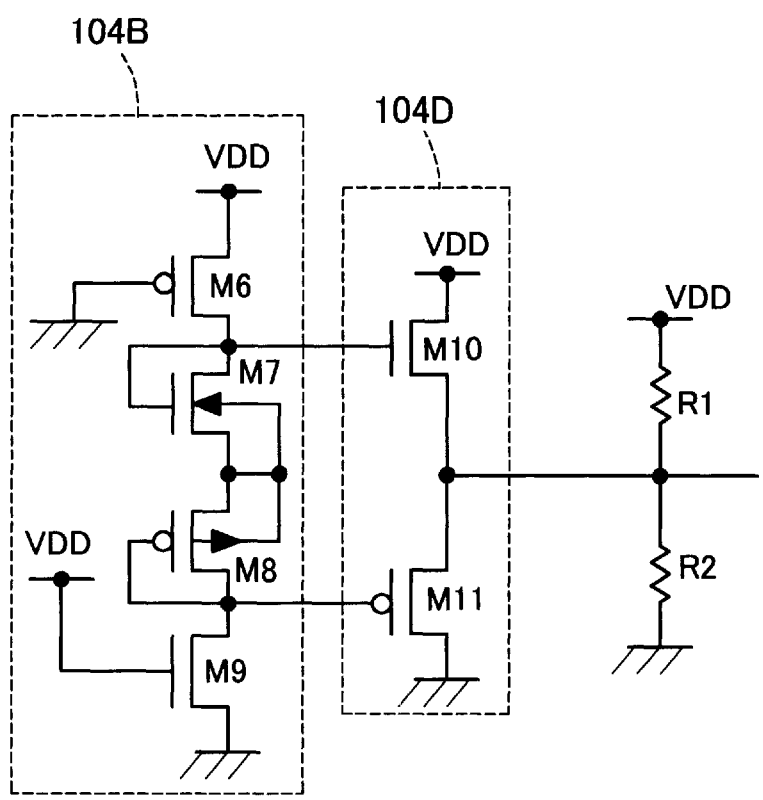
FIG. 16 is a circuit diagram showing a reference voltage generation circuit.

A semiconductor memory device 1 (hereinafter referred to as a DRAM 1) according to a first embodiment of the invention shown in FIG. 1 comprises NMOS transistors M1 to Mk for connecting both a line VPR and a line VCP as feeders for reference voltages VPR, VCP from a reference voltage generation circuit 104 in each cell block B1 to Bk, in addition to the configuration of the DRAM 1000 according to a conventional art (see FIG. 15).

Gate terminals of the NMOS transistors M1 to Mk are connected to a common signal φCPR. The signal φCPR outputs a positive logical level at a predetermined time after power-on. A circuit for generating the signal φCPR can use an output signal from a power-on reset circuit for detecting power-on and outputting a pulse signal for a predetermined time period. In addition, a circuit which has a response characteristic of delaying only a trailing edge of the pulse signal can be added as a circuit for receiving the output signal from the power-on reset circuit and extending the pulse width of a power-on reset signal at a predetermined time.

In a large-capacity DRAM 1, the area where the cell blocks B1 to Bk are arranged is large. Accordingly, the total wiring length of each of the feeders (the lines VPR, VCP) is large and parasitic resistances RPR0 to RPRk, RCP0 to RCPk exist on the wiring paths. Therefore, by providing the NMOS transistors M1 to Mk for short-circuiting the line VPR with the line VCP in each cell block B1 to Bk, both lines are short-circuited in each cell block B1 to Bk at power on.

Many memory cells C00 to Cnm are connected to each bit line BL0 to /BLm through transfer gates. The transfer gates are composed of NMOS transistors and the drain terminals of thereof are connected to the bit lines BL0 to /BLm. Therefore, many junction capacitances are added to the bit lines BL0 to /BLm. Furthermore, in the large-capacity DRAM 1, the distance between the bit lines BL0 to /BLm and the distance between the intersections of the bit lines BL0 to /BLm and the word lines WL0 to WLn are both small. Therefore, interline capacitances become large by necessity, and wiring line capacitances CBL, CBBL of each bit line BL0 to /BLm become large (see FIG. 2).

Figure 2:
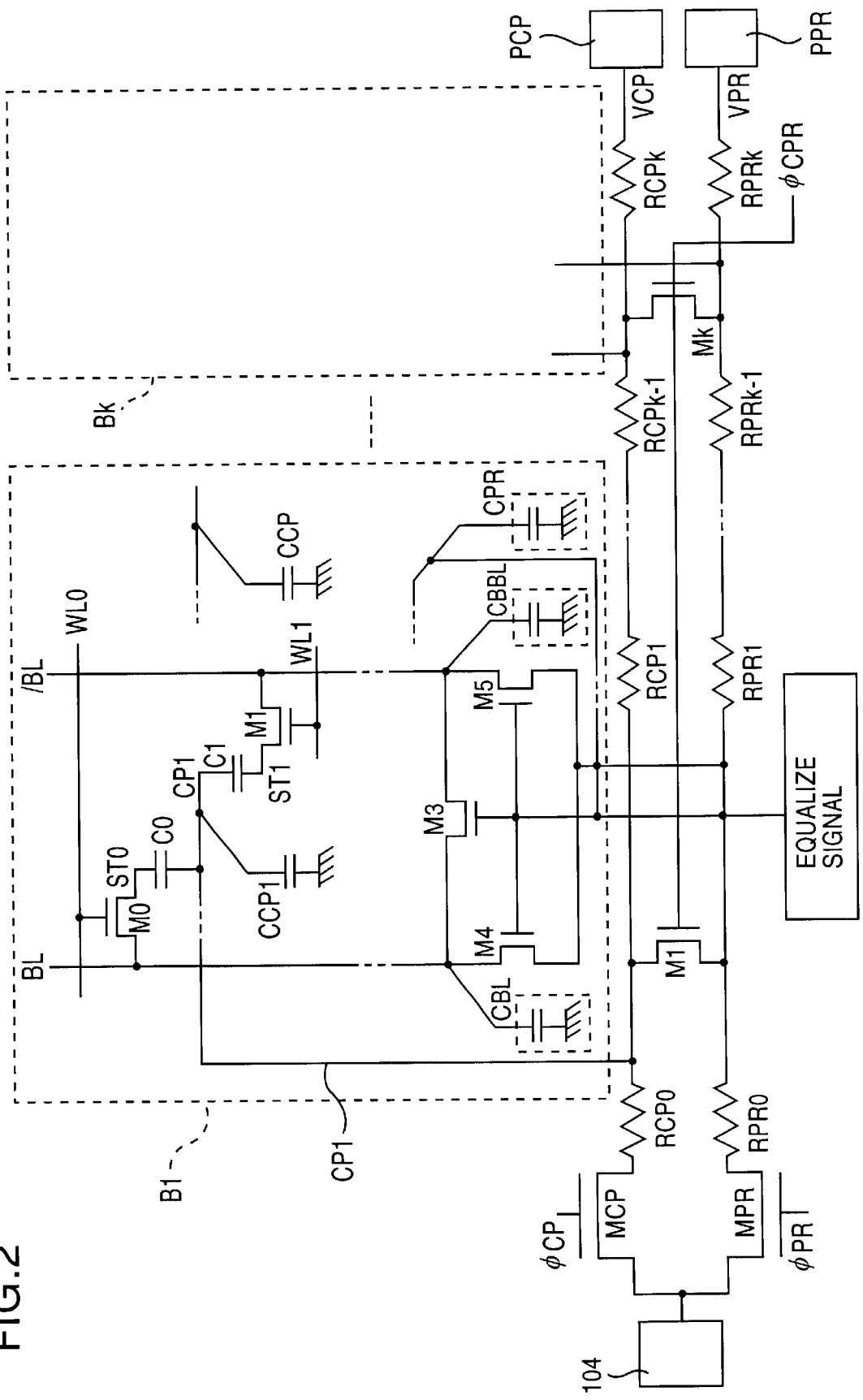
FIG. 2 is a schematic diagram showing the effect of the first embodiment.

As shown in FIG. 2, the wiring line capacitances CBL, CBBL of all bit lines BL0 to /BLm are added at the time of bit line equalization to form a bit line equalization capacitance CPR. The bit line equalization capacitance CPR becomes considerably large compared to a cell plate parasitic capacitance CCP. The cell plate parasitic capacitance CCP is a sum of parasitic capacitances CCP1 that are added to a cell plate CP1 in each memory cell unit U.

In the DRAM 1 according to the first embodiment of the invention, even if charge is transferred from charge storage nodes as second terminals to the cell plate CP1 as a reference terminal by capacitive coupling when the charge is injected into or released from the capacitive elements in the memory cells C00 to Cnm where no charge is stored and neither data "0" nor data "1" exists at power-on, a potential fluctuation at the cell plate CP1 can be suppressed by connecting the bit line equalization capacitance CPR, which is a sum of the wiring line capacitances of the bit lines BL0 to /BLm as a plurality of data lines, as a potential fluctuation suppression capacitive element. At this point, the bit line equalization capacitance CPR is divided and arranged in each cell block B1 to Bk. Therefore, a parasitic resistance added to individual bit line equalization capacitance CPR does not become large, and an unnecessary delay component formed by combination of a parasitic resistance and a capacitive component is not added. If a capacitive element other than the bit line equalization capacitance CPR is connected to the cell plate CP1 as a potential fluctuation suppression capacitive element, the same effect can be obtained.

Moreover, a wiring line resistance between the reference voltage generation circuit 104 and the cell plate CP1 can be reduced by connecting the line VPR as a first wiring line with the line VCP as a second wiring line. Therefore, the driving capacity of the reference voltage generation circuit 104 can be effectively used, and the charge transferred by capacitive coupling can be effectively absorbed to suppress a potential fluctuation at the cell plate CP1.

Furthermore, since it is possible to connect the line VPR with the line VCP only during a predetermined time period after power-on, the independence of both lines VPR and VCP can be maintained by separating the lines VPR, VCP so as to eliminate mutual interference due to noise and the like. In addition, while it is still possible to obtain the conventional effect that different voltages can be applied to the lines VPR, VCP at the time of test, the potential fluctuation at the cell plate CP1 can be suppressed at power-on.

Owing to these effects, written data can be effectively prevented from being garbled or disappearing at power-on, excessive electric field stress is not applied to a dielectric film 17 between the terminals of cell capacitors C0, C1 as capacitive elements, and an operation causing a problem regarding reliability does not occur. In addition, since the driving capability of the reference voltage generation circuit 104 does not need to be made larger than necessary to realize these effects, an increase in the current consumption and burdens due to an increase in the chip area occupied by the reference voltage generation circuit 104 can be minimized.

The semiconductor memory device can be configured such that the fluctuation suppression capacitive element is connected to the cell plate CP1 by a capacitive connection switch element only at power-on. According to this configuration, the potential fluctuation at the cell plate CP1 can be suppressed by adding the potential fluctuation suppression capacitive element to the cell plate CP1 only at power-on, without adding it during normal operations.

The potential fluctuation suppression capacitive element can be divided and arranged in each cell block B1 to Bk. According to this arrangement, just as in the case of the bit line equalization capacitance CPR, a parasitic resistance added to individual potential fluctuation suppression capacitive element does not become large, and an unnecessary delay component formed by combination of a parasitic resistance and a capacitive component is not added.

The potential fluctuation suppression capacitive elements, the capacitive connection switch elements, or wiring line connection switch elements M1 to Mk can be arranged in a memory cell area as a storage cell area where the cell blocks B1 to Bk are arranged. For example, the potential fluctuation suppression capacitive elements can be superposed on the cell plate CP1 if a conductive electrode is formed on the cell plate CP1 constituting cell capacitors in the memory cells C00 to Cnm via a predetermined oxide film. Thus, it is not necessary to secure specific areas for the potential fluctuation suppression capacitive elements on the chip. In addition, since only one of the wiring line connection switch elements M1 to Mk needs to be arranged in each cell block B1 to Bk, the chip area occupied by the wiring line connection switch elements is extremely small, and thus the wiring line connection switch elements can be arranged without reducing the memory cell area.

In addition, if the potential fluctuation suppression capacitive elements are superposed on the cell plate CP1 as described above, the potential fluctuation suppression capacitive elements can be fixedly connected to the cell plate CP1. Therefore, the potential fluctuation at the cell plate CP1 can be suppressed without controls such as connecting the potential fluctuation suppression capacitive elements to the cell plate CP1 only during a predetermined time period after power-on.

Although NMOS transistors were described as an example of the wiring line connection switch elements M1 to Mk, PMOS transistors may be used in the configuration. The so-called transmission gate formed by connecting a PMOS transistor with an NMOS transistor as a pair or other circuits having a switching characteristic may be employed. Similarly, NMOS transistors, PMOS transistors, transmission gates, or other switching circuits may be used as the capacitive connection switch elements in the configuration.

Figure 3:
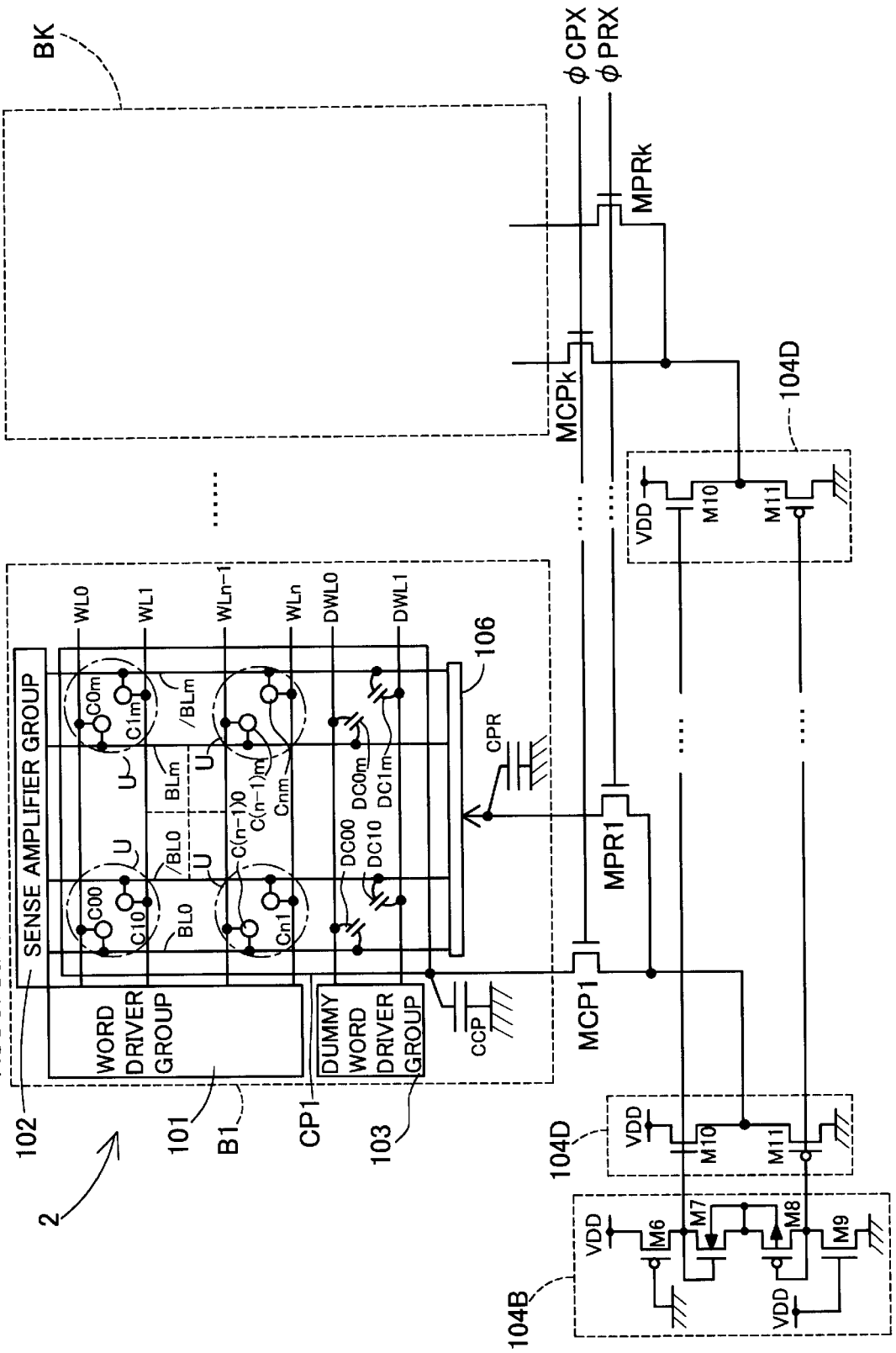
FIG. 3 is a circuit block diagram showing a semiconductor memory device according to a second embodiment.

In a semiconductor memory device 2 (hereinafter referred to as a DRAM 2) according to a second embodiment of the invention shown in FIG. 3, a reference voltage generation portion 104B and reference voltage drive portions 104D to 104D which are constituents of the reference voltage generation circuit 104 of the DRAM 1000 according to the conventional art (see FIG. 15) are divided and arranged, instead of the reference voltage generation circuit 104. The reference voltage drive portions 104D to 104D are dispersedly distributed to each cell block B1 to Bk to supply a voltage VCP to each cell plate CP1 to CP1 in each cell block B1 to Bk. The reference voltage generation portion 104B outputs a reference voltage value signal for setting the reference voltage to be supplied by the reference voltage drive portions 104D to 104D. Signals output from a connection point between MOS transistors M6 and M7 and a connection point between MOS transistors M8 and M9 are input as bias signals to each gate terminal of NMOS transistors M10 to M10 and PMOS transistors M11 to M11 in the reference voltage drive portions 104D to 104D.

It is also possible to make a configuration in which the output of each reference voltage drive portion 104D to 104D is divided and connected to the bit lines BL0 to /BLm to BL0 to /BLm and the cell plates CP1 to CP1 through NMOS transistors NPR1 to MPRk and MCP1 to MCPk, and the voltages of each bit line and each cell plate are biased separately, instead of using the NMOS transistors MPR, MCP in the DRAM 1000 according to the conventional art.

In the DRAM 2 according to the second embodiment of the invention, the reference voltage generation circuit is divided into the reference voltage generation portion 104B and the reference voltage drive portions 104D to 104D. The reference voltage value signal connected from the reference voltage generation portion 104B to the reference voltage drive portions 104D to 104D is a bias signal. Therefore, when the input impedance of the MOS transistors M10 to M10 and M11 to M11 is set at a high value, no large potential difference occurs even if long wiring lines are routed. Accordingly, the reference voltage drive portions 104D to 104D can be arranged in the vicinity of the cell plates CP1 to CP1. Since there is no load such as a wiring line resistance or a wiring line capacitance between the reference voltage drive portions 104D to 104D and the cell plates CP1 to CP1, the potential of the cell plates CP1 to CP1 can be effectively retained and the potential fluctuation at the cell plates CP1 to CP1 can be suppressed.

In addition, since the cell plate CP1 to be driven by each reference voltage drive portion 104D is limited in each cell block B1 to Bk, the load to be driven can be made small and the driving capability of the reference voltage drive portions 104D to 104D can be made small. Therefore, the chip area occupied by the reference voltage drive portions can be minimized by setting the circuit size of the reference voltage drive portions 104D to 104D so as to be small. The device size of the NMOS transistors MPR1 to MPRk and MCP1 to MCPk provided for biasing the voltages of each of the bit lines BL0 to /BLm to BL0 to /BLm and each of the cell plates CP1 to CP1 separately can be made small, because the load to be driven by the reference voltage drive portions 104D to 104D is limited in each cell block B1 to Bk.

The reference voltage drive portions 104D to 104D can be arranged in a memory cell area as a storage cell area where the cell blocks B1 to Bk are arranged. Since each reference voltage drive portion 104D needs to drive only the cell plate CP1 in each cell block B1 to Bk, it needs to have only a limited driving capability. Therefore, the circuit size of the reference voltage drive portion 104D becomes small, and the chip area occupied by the reference voltage drive portion 104D is extremely small. Thus, the reference voltage drive portion 104D can be arranged without reducing the memory cell area.

PMOS transistors may be used as MPR1 to MPRk and MCP1 to MCPk in the configuration instead of NMOS transistors. In addition, the so called transmission gate formed by connecting a PMOS transistor with an NMOS transistor as a pair, or any other circuits having a switching characteristic may be employed.

Figure 4:
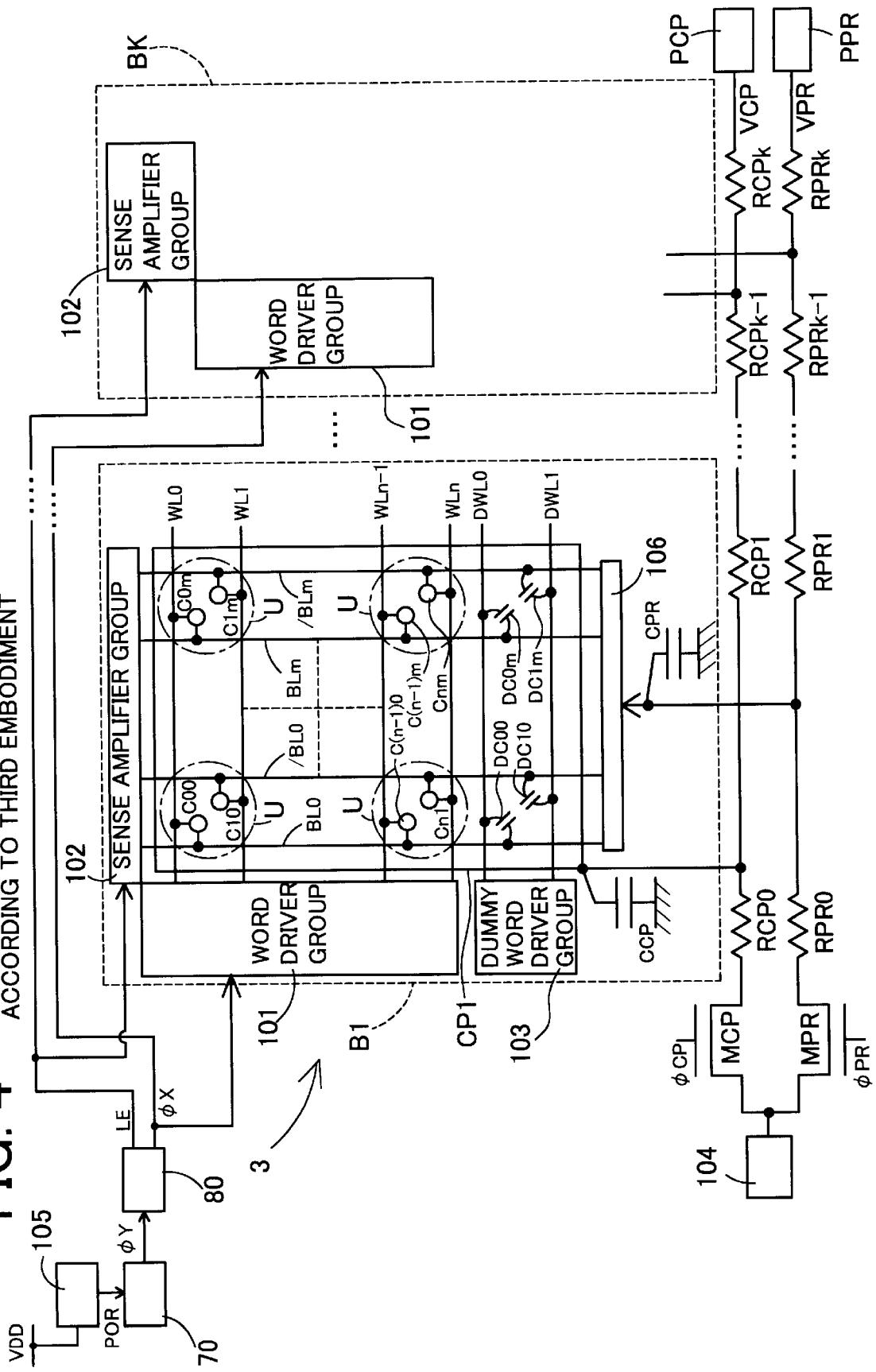
FIG. 4 is a circuit block diagram showing a semiconductor memory device according to a third embodiment.

A semiconductor memory device 3 (hereinafter referred to as a DRAM 3) according to a third embodiment of the invention shown in FIG. 4 comprises a power supply detection circuit 105 for detecting the input of a power supply voltage, a pulse extension circuit 70 for extending the pulse width of a pulse output signal POR from the power supply detection circuit 105, and a control circuit 80 for operating in response to an output signal φY from the pulse extension circuit 70, in addition to the configuration of the DRAM 1000 according to the conventional art (see FIG. 15). The control circuit 80 outputs a sense amplifier group activation signal LE together with a word line activation signal φX. Both signals are output to each cell block B1 to Bk. As the power supply detection circuit 105 and the pulse width expansion circuit 70, existing circuits can be used. For example, the power supply detection circuit 105 is a power-on reset circuit, and outputs a positive pulse signal POR as its output signal at power-on. The pulse width expansion circuit 70 is a circuit which adds delay only to a trailing edge of the positive input pulse signal POR. The pulse extension circuit 70 outputs an extended pulse signal φY which is generated by extending the pulse width of the input pulse signal POR toward the trailing side.

Figure 5:
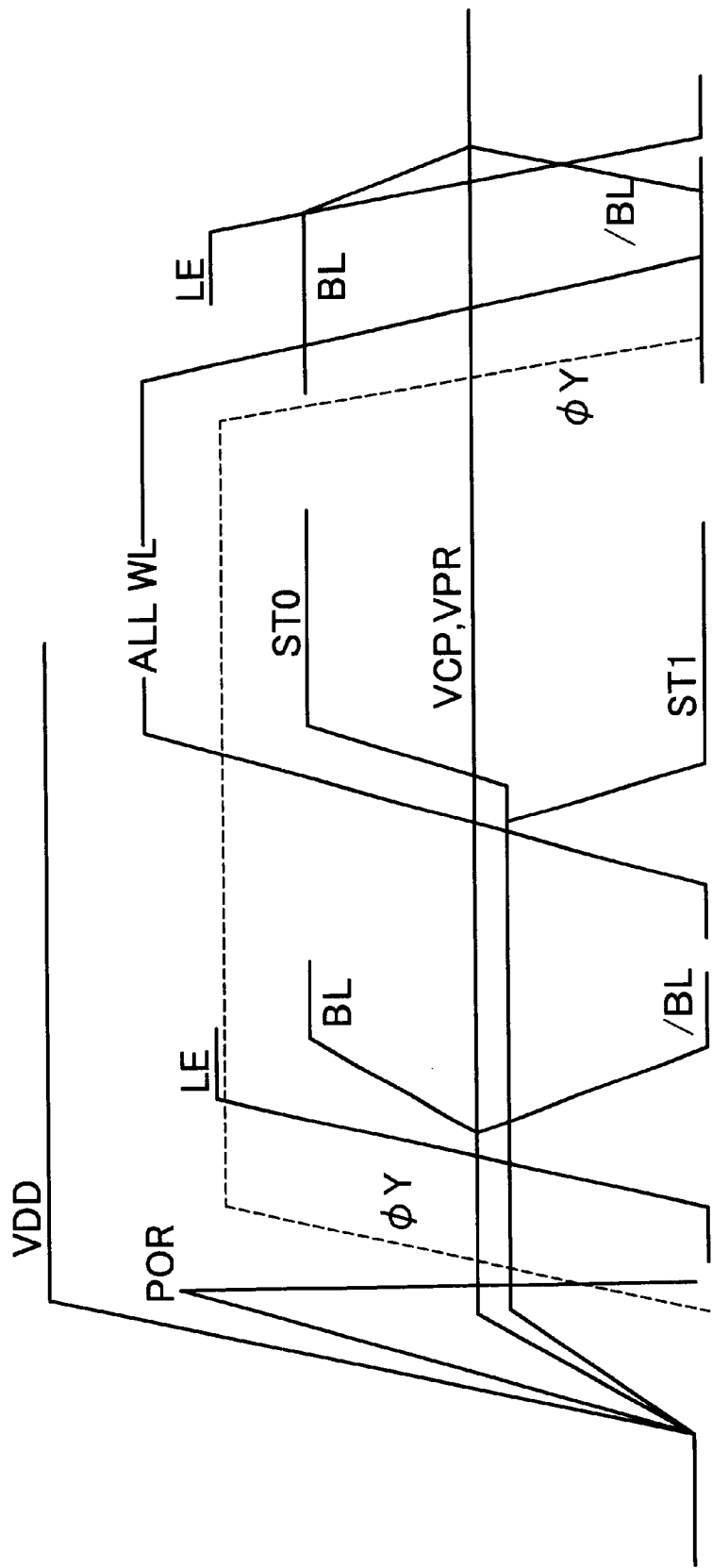
FIG. 5 is a waveform diagram showing the operation of the semiconductor memory device according to the third embodiment.

Next, the circuit operation at power-on will be described based on the waveform diagram in FIG. 5. When power is turned on and a power supply voltage VDD is booted, the power supply detection circuit 105 outputs the positive pulse signal POR. The pulse extension circuit 70 which receives the pulse signal POR outputs the extended pulse signal φY. The extended pulse signal φY is a signal generated by delaying the trailing edge of the pulse signal POR to extend the pulse width toward the trailing side. The extended pulse signal φY is input to the control signal 80. The control circuit 80 outputs a sense amplifier group activation signal LE at first. This signal simultaneously activates all sense amplifier circuits provided in a sense amplifier group 102, thereby bit line pairs BL0 and /BL0 to BLm and /BLm connected to each sense amplifier circuit being differentially amplified. Each bit line pair is differentially amplified according to uncertain factors such as a difference in equalization voltage of each bit line pair, a difference in sensitivity of the sense amplifier circuit, and disturbance at the time of differential amplification. Therefore, the direction in which the bit line pairs are differentially amplified is uncertain.

Upon the completion of the differential amplification of the bit line pairs BL0 and /BL0 to BLm and /BLm, the control circuit 80 outputs the word line activation signal φX to simultaneously select all word lines WL0 to WLn provided in a word driver group 101. When the word lines are selected, transfer gates M0, M1 of each memory cell C00 to Cnm are brought into conduction, and charge storage nodes ST0, ST1 of cell capacitors C0, C1 are connected to each of the bit lines. Since each bit line pair has been differentially amplified at this point, the voltage after differential amplification is written in each cell capacitor C0, C1. (FIG. 5 shows the case in which a logical high level voltage is written in ST0 and a logical low level voltage is written in ST1.) Because all bit lines are paired via the sense amplifier circuits, the number of the cell capacitors C0, C1 where a logical high level voltage is written and the number of the cell capacitors C0, C1 where a logical low level voltage is written become the same after the bit line pairs are differentially amplified.

When the extended pulse signal φY is finished after writing in the cell capacitors C0, C1 is completed, the control circuit 80 inactivates the word line activation signal φX and deselects the word lines WL0 to WLn. Then, the control circuit 80 finishes the sense amplifier group activation signal LE, deactivates all sense amplifier circuits, and equalize the bit line pairs to complete its operation. This operation is performed during the so-called pause time, i.e., a standby time between the power-on and the start of a normal operation.

In the DRAM 3 according to the third embodiment, the memory cells C00 to Cnm into which charge is injected and the memory cells C00 to Cnm from which charge is released are paired. Therefore, the amount of the charge supplied to the cell plate CP1 through the cell capacitors C0, C1 by capacitive coupling is cancelled, and thus the potential fluctuation at the cell plate CP1 can be suppressed.

Figure 6:
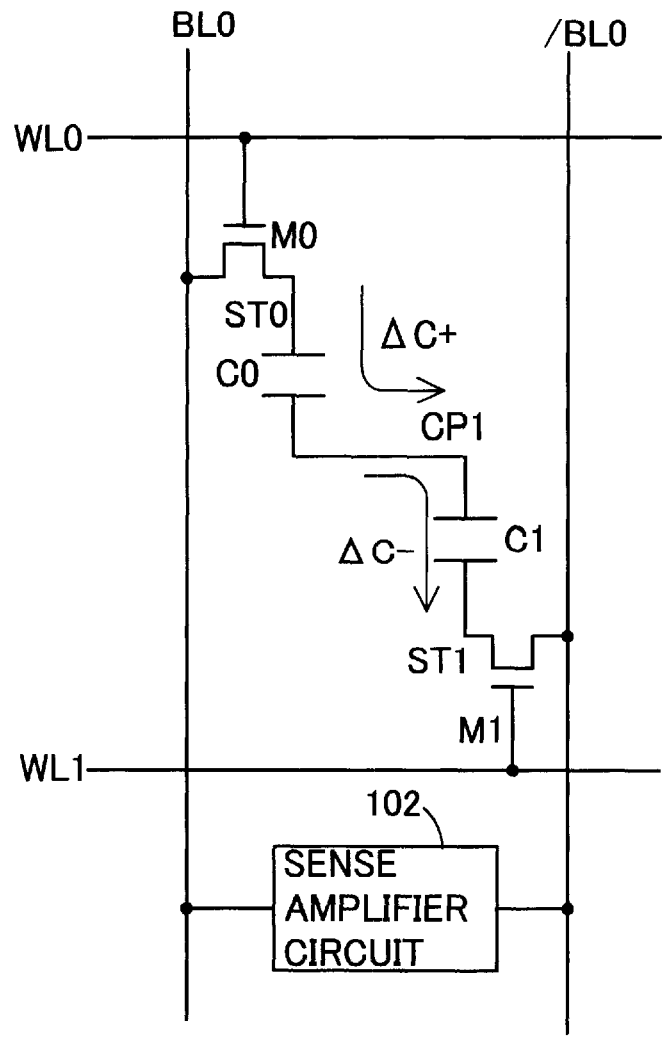
FIG. 6 is a circuit diagram showing the operation of the semiconductor memory device according to the third embodiment.

This operation is shown in FIG. 6. A bit line pair BL0 and /BL0 is restored due to the potential difference amplified by a sense amplifier circuit 106. If the voltage of the bit line BL0 is restored to a logical high level voltage and the voltage of the bit line /BL0 is restored to a logical low level voltage, and word lines WL0, WL1 are selected under this condition, NMOS transistors M0, M1 constituting transfer gates are both brought into conduction, and charge storage nodes ST0, ST1 are connected to the bit lines BL0, /BL0. In other words, the voltage of the charge storage node ST0 becomes a logical high level voltage, and charge is injected into the charge storage node ST0. On the contrary, the voltage of the charge storage node ST1 becomes a logical low level voltage, and charge is released from the charge storage node ST1. When the charge is injected into or released from the charge storage nodes ST0, ST1, charge is injected into or released from a cell plate CP1 through the cell capacitors C0, C1 by capacitive coupling. Specifically, charge is injected from the cell capacitor C0 into a cell plate CP1 due to the injection of charge into the charge storage node ST0 (the charge injected into the cell plate CP1 is indicated as ΔC+). Charge is released from the cell plate CP1 due to the release of charge from the charge storage node ST1 (the charge released from the cell plate CP1 is indicated as ΔC−). The potentials of the charge storage nodes ST0, ST1 before the selection of the word lines WL0, WL1 are nearly the same as the equalization voltage of the bit line pair. This voltage is an arithmetic average of the logical high level voltage and the logical low level voltage at the time of restoration. Therefore, the capacitive coupling effects by both cell capacitors C0, C1 are nearly equal (ΔC+=AC−). Consequently, the amounts of the charge injected into and released from the cell plate CP1 by capacitive coupling are cancelled. Thus, a potential fluctuation does not occur at the cell plate CP1.

If an equal number of memory cells are selected on each bit line of the bit line pairs BL0 and /BL0 to BLm and /BLm connected to pairs of the memory cells C00 to Cnm in memory cell units U, the amount of the charge transferred between the memory cells by injection and release is cancelled, thereby a potential fluctuation at the cell plate CP1 being suppressed without requiring an intentional selection of data to be written.

There has been described the case in which the word line activation signal φX simultaneously selects all word lines WL0 to WLn, and the sense amplifier group activation signal LE simultaneously activates all sense amplifier circuits to simultaneously restore all bit line pairs BL0 and /BL0 to BLm and /BLm. In this case, data is written in all memory cells C00 to Cnm, and a potential fluctuation does not occur at the cell plate CP1 in the subsequent access operation. However, the potential fluctuation at the cell plate CP1 is a phenomenon depending on the balance between the driving capability of the reference voltage generation circuit 104 and capacitive coupling. Therefore, if the reference voltage generation circuit 104 permits, it is not necessary to simultaneously activate all word lines and all bit line pairs. It is also possible to activate only part of the word lines and the bit line pairs within the limit of the driving capability of the reference voltage generation circuit 104.

The above description of the third embodiment shows the sequence in which the bit line pairs BL0 and /BL0 to BLm and /BLm are restored due to the activation of the sense amplifier circuits, and then the word lines WL0 to WLn are selected and the bit lines are connected with the cell capacitors C0, C1 to write the restoration voltages in the cell capacitors C0, C1. However, there is no restriction on the voltages to be written except the requirement that the number of the capacitors where the logical high level voltage is written and the number of the capacitors where the logical low level voltage is written should be the same. Therefore, this requirement can be satisfied if arbitrary different voltages at the bit line pair are restored and written. In other words, if a time period during which the timing of selecting the word lines and the timing of activating the sense amplifier circuits overlap each other is set, the timings of starting and finishing both the word lines and the sense amplifier circuits can be set freely without a specific restriction.

As a signal at power-on, an output signal from the power supply detection circuit 105 such as a power-on reset circuit can be directly used besides the above-mentioned extended pulse signal φY. As for the logic of the pulse signal, a negative pulse can be used besides the above-mentioned positive pulse. Furthermore, the output signal from the power supply detection circuit 105 such as a power-on reset signal does not need to be a pulse signal, and may be a binary signal provided that power-on can be detected.

It is preferable that the circuit operation in the third embodiment is performed in each cell block. Thus, the memory cells where charge is transferred in a direction and the memory cells where charge is transferred in opposite directions are closely arranged. This allows the effect of canceling the amount of the transferred charge to be improved.

Figure 7:
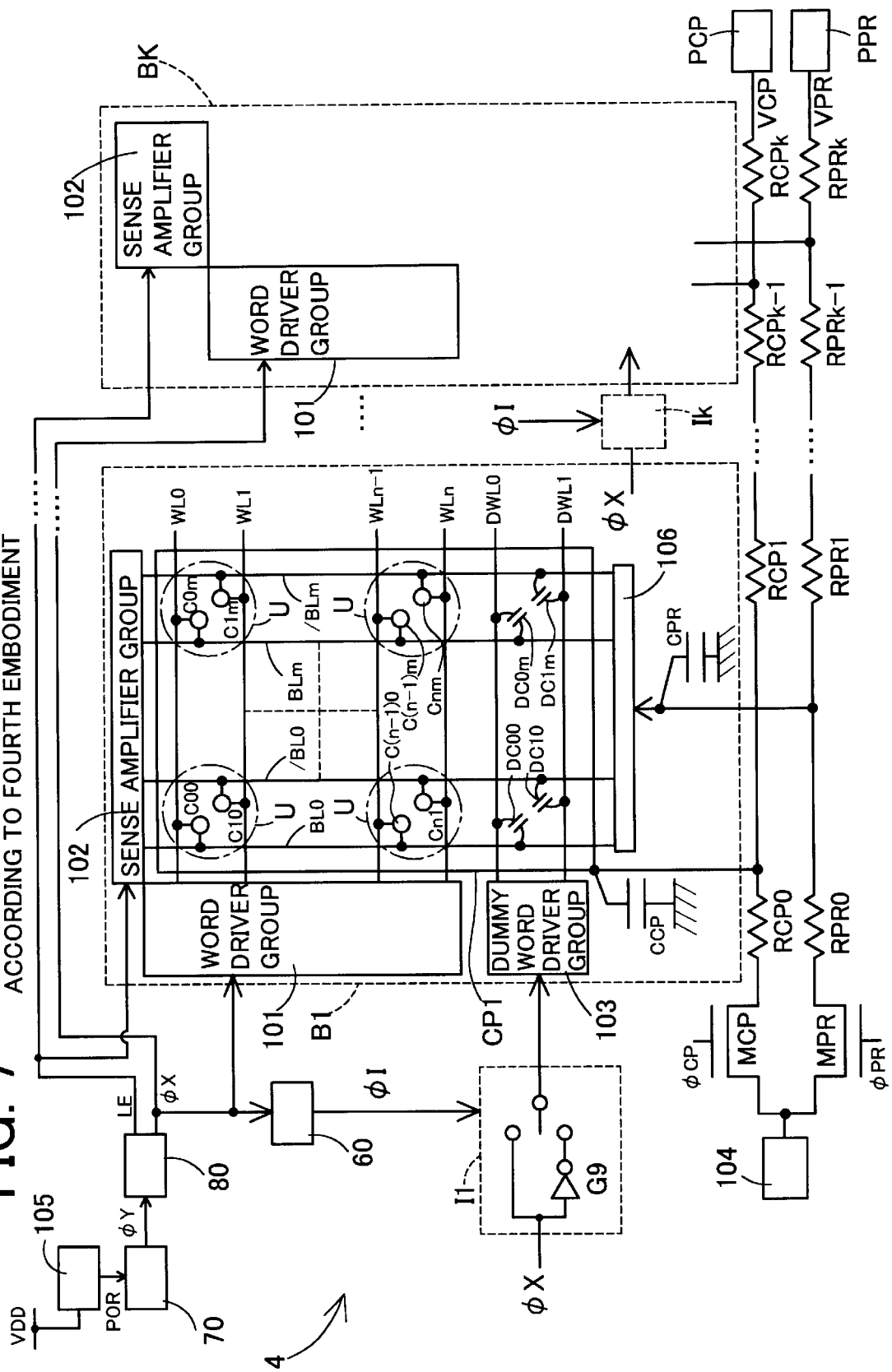
FIG. 7 is a circuit block diagram showing a semiconductor memory device according to a fourth embodiment.

A semiconductor memory device 4 (hereinafter referred to as a DRAM 4) according to a fourth embodiment of the invention shown in FIG. 7 comprises, in addition to the configuration of the DRAM 3 according to the third embodiment (see FIG. 4), an inversion selection circuit 60 for receiving the output signal φX from the control circuit 80 and outputting an inversion indication signal φI to control the logic of dummy word lines DWL0, DWL1 to be inverted in accordance with the word lines WL0 to WLn to be activated, and inversion switch circuits I1 to Ik for receiving the inversion indication signal φI and inverting the dummy word lines DWL0, DWL1 selected by the signal φX.

The dummy word lines DWL0, DWL1 are lines for additionally supplying charge to bit line pairs BL0 and /BL0 to BLm and /BLm through dummy cells DC00 to DC1m by capacitive coupling to ensure the differential amplification operation performed by sense amplifier circuits provided in a sense amplifier group 102. In the configuration according to this embodiment, charge is additionally supplied to obtain the assist 1 effect of facilitating reading information "1" which increases the potential of each bit line.

Figure 8:
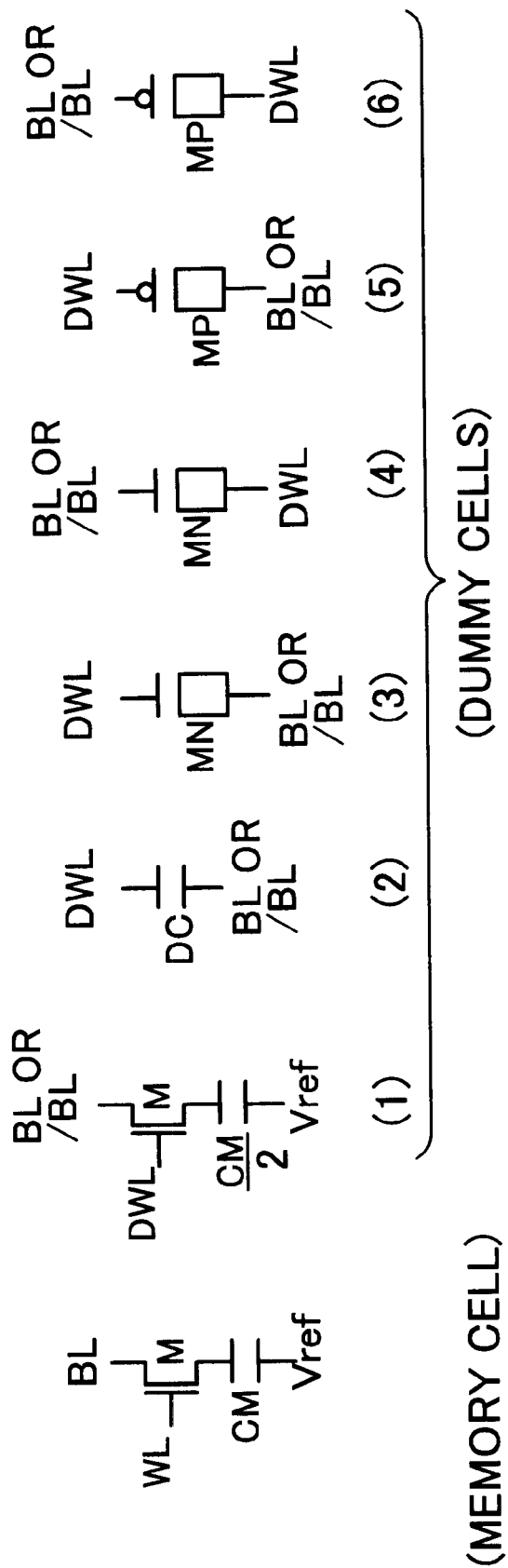
FIG. 8 is a circuit diagram showing examples of dummy cells.

FIG. 8 shows specific dummy cell configurations. In this figure, six types of dummy cell configurations are shown. (1) shows a configuration in which a transfer gate M is controlled by means of a dummy word line DWL to connect a dummy cell capacitor CM/2 having a smaller capacitance value (one-half in this case) than that of a cell capacitor CM to bit lines BL, /BL. This configuration is similar to the configuration of a memory cell. (2) shows a configuration in which a dummy capacitor DC is connected between bit lines BL, /BL and a dummy word line DWL. (3) and (4) show configurations using a gate capacitance of an NMOS transistor MN. The gate terminal is connected to bit lines BL, /BL in one of these two configurations, while the gate terminal is connected to a dummy word line DWL in the other configuration. (5) and (6) show configurations which are the same as the configurations in (3) and (4), respectively, except that a PMOS transistor is used instead of the NMOS transistor MN.

Figure 9:
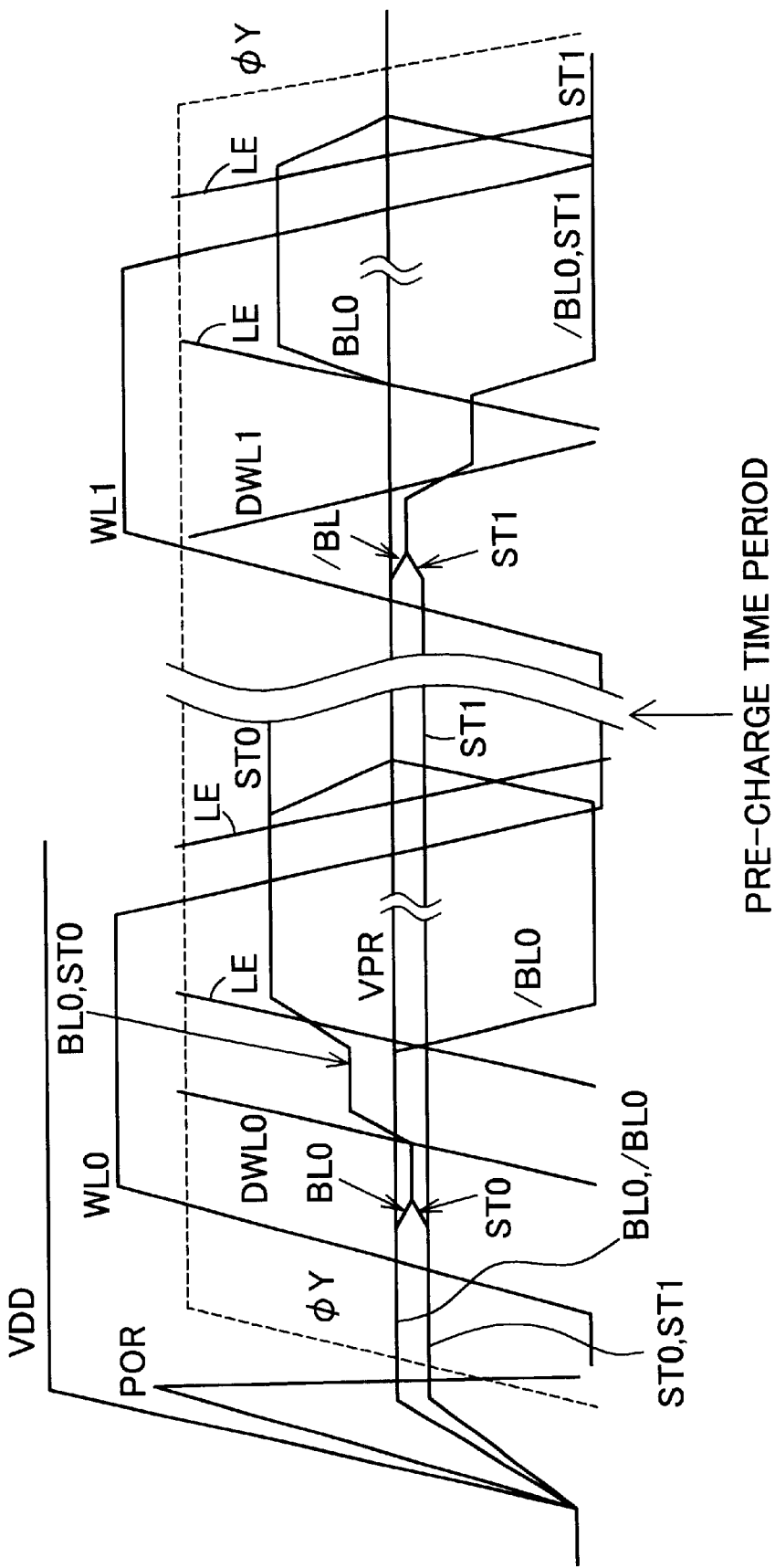
FIG. 9 is a waveform diagram showing the operation of the semiconductor memory device according to the fourth embodiment.

Hereinafter the circuit operation at power-on will be described based on the waveform diagram shown in FIG. 9.

Figure 17:
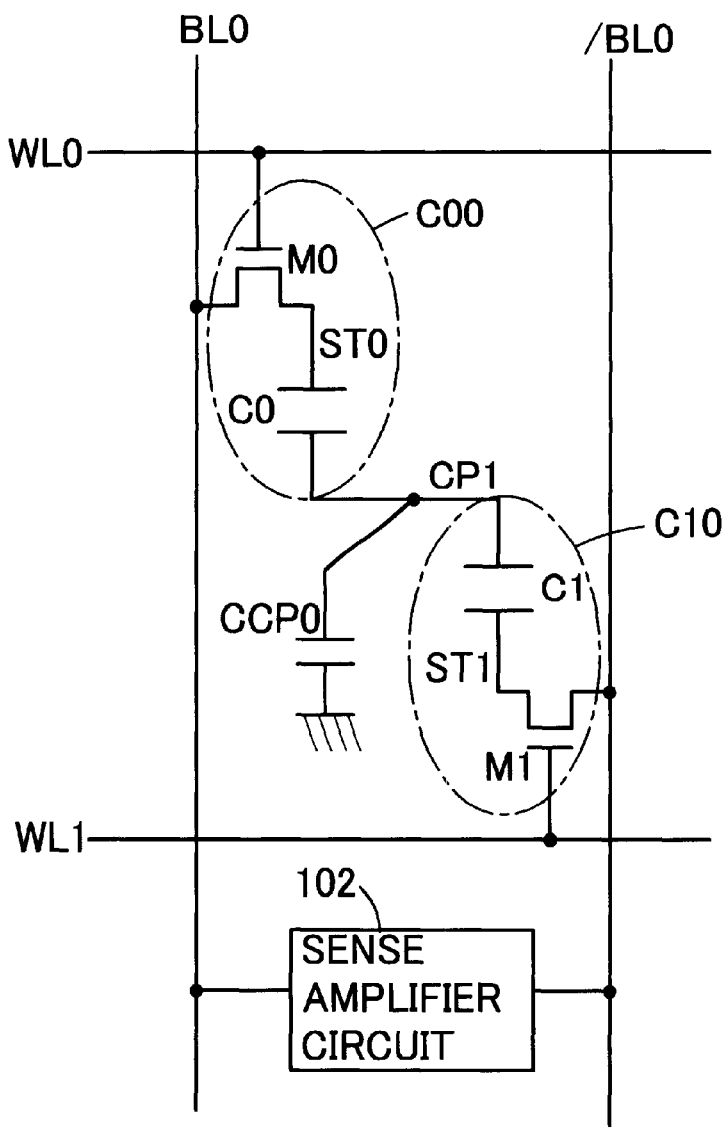
FIG. 17 is a circuit diagram showing a memory cell pair connected to a bit line pair.
Figure 18:
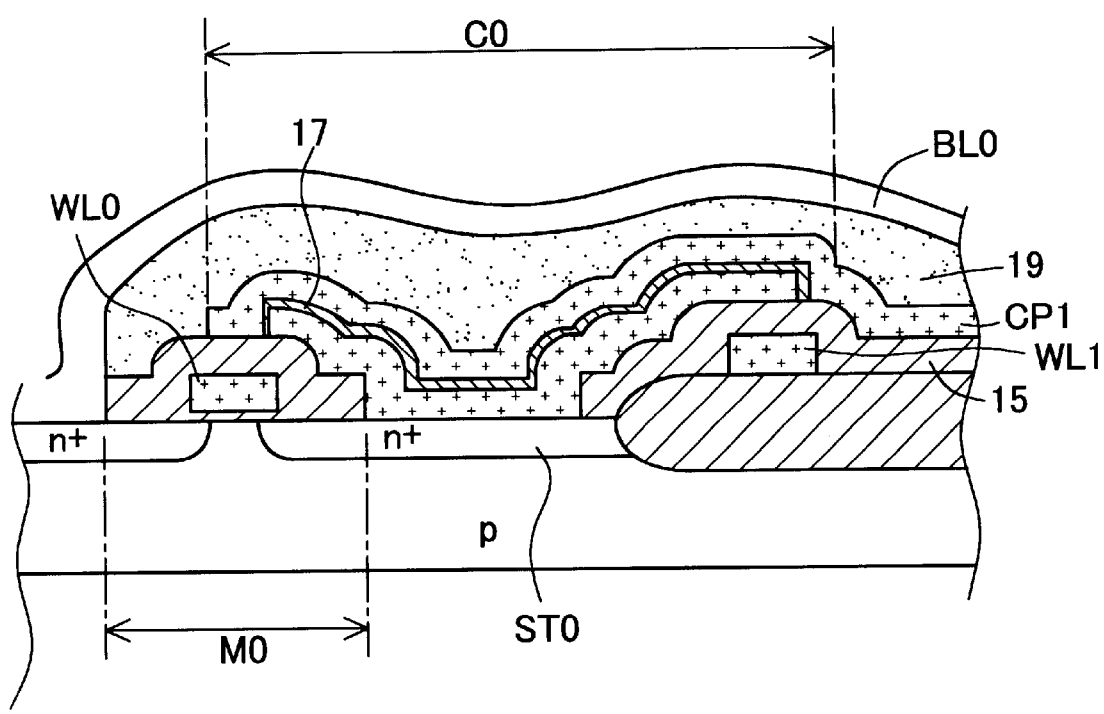
FIG. 18 is a cross section view of a memory cell.
Figure 19:
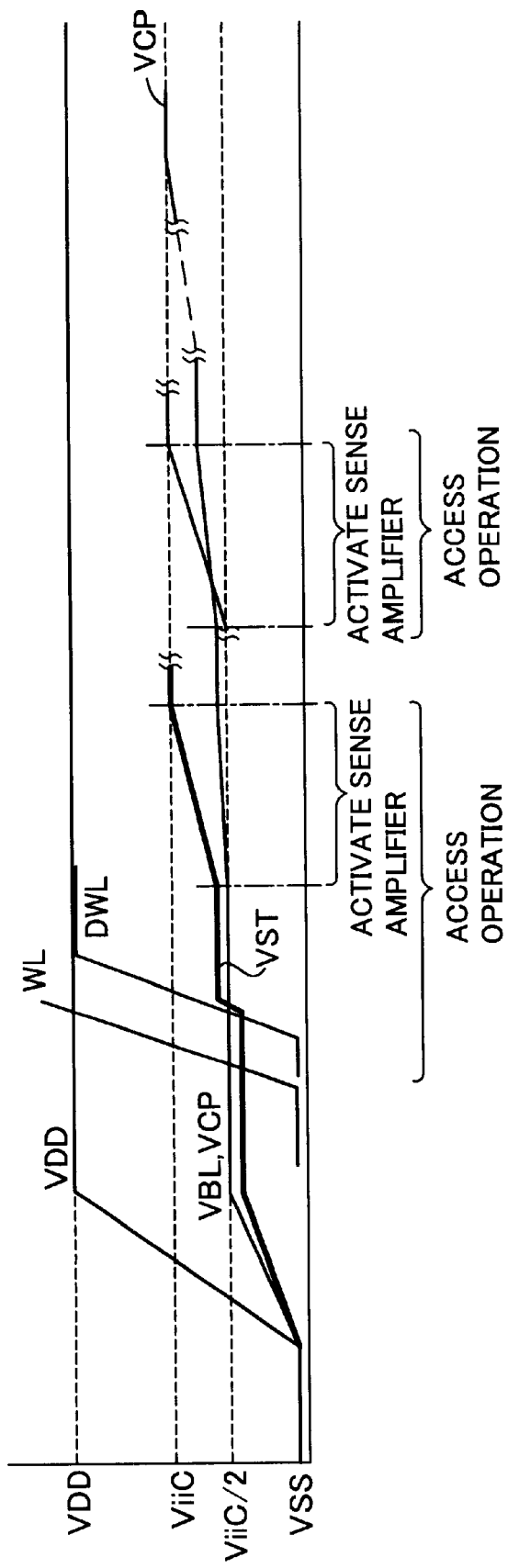
FIG. 19 is a waveform diagram showing the operation of the semiconductor memory device according to the conventional art.

In this description, references will be made to the circuit diagram of a memory cell pair shown in FIG. 17. When power is turned on and a power supply voltage VDD is booted, a power supply detection circuit 105 outputs a positive pulse signal POR. A pulse extension circuit 70 which receives the pulse signal POR outputs an extended pulse signal φY. A control circuit 80 which receives the extended pulse signal φY outputs a word line activation signal φX and a sense amplifier group activation signal LE.

At first, a word line WL0 selected by the word line activation signal φX is booted, and a transfer gate M0 is brought into conduction. A charge storage node ST0 whose potential has been increased near to a reference voltage (for example, Viic/2) due to the capacitive coupling with a cell plate CP1 at power-on is connected to a bit line BL0 which has been equalized to the reference voltage (for example, Viic/2). Then, the dummy word line DWL0 is selected, thereby the assist 1 effect being exerted on the bit line BL0 to increase the potential of the bit line BL0. Thus, the potential difference between the bit lines BL0 and /BL0 is increased to wait for a restoration operation.

Next, the sense amplifier activation signal LE is activated, each sense amplifier circuit is started, and the bit line pair BL0 and /BL0 is restored. Whereby data 1 is written in the charge storage node ST0. In other words, charge is injected into the charge storage node ST0.

After the pre-charge operation, the word line WL1 is selected by the word line activation signal φX, and the similar operation is repeated. However, since the inversion selection circuit 60 receives the output signal φX during the pre-charge time period and outputs the inversion indication signal φI to control the logic of the dummy word line DWL1 to be inverted, the inversion switch circuits I1 to Ik add a signal inversion circuit G9 to the path from the word line activation signal φx to the dummy word line DWL1.

Accordingly, the direction of signal transition on the dummy word line DWL 1 is inverted, the assist 0 effect of decreasing the bit line potential to facilitate reading information "0" is exerted on the bit line /BL0, and the data 0 is written in the charge storage node ST1. In other words, charge is released from the charge storage node ST1.

The direction of signal transition on half of the dummy word lines is inverted such that the data 1 and the data 0 are written in the same number of the charge storage nodes in the memory cells, respectively, and the writing operation is repeated.

In the DRAM 4 according to the fourth embodiment, the memory cells C00 to Cnm into which charge is injected and the memory cells C00 to Cnm from which charge is released are paired. Therefore, the amount of the charge supplied to the cell plate CP1 through the cell capacitors C0, C1 by capacitive coupling is cancelled, and a potential fluctuation at the cell plate CP1 can be suppressed.

In the case where the dummy cells DC00 to DC1m are used to improve the margin of the differential amplification operation performed by the sense amplifier circuits, the logical level with regard to half of the dummy selection lines DWL0, DWL1 capacitive-coupled to the dummy cells is inverted. According to this arrangement, half of the charge supply to the bit lines BL0 to /BLm through the dummy cells by assist 1 can be changed to the charge supply by assist 0. It is not necessary to intentionally select data to be written in the memory cells C00 to Cnm. The number of the cell capacitors C0, C1 into which charge is injected and the number of the cell capacitors C0, C1 from which charge is released are set to be the same. Thus, a potential fluctuation at the cell plate CP1 can be suppressed by canceling the amount of the charge transferred between the charge storage node ST0, ST1 and the cell plate CP1.

In the description of the fourth embodiment, there has not been described the number of the memory cells C00 to Cnm where complementary data is written. If data is written in all memory cells, a potential fluctuation due to a subsequent operation does not occur at the cell plate CP1. However, the potential fluctuation at the cell plate CP1 is a phenomenon depending on the balance between the driving capability of the reference voltage generation circuit 104 and capacitive coupling. Therefore, if the reference voltage generation circuit 104 permits, it is not necessary to write data in all memory cells. It is also possible to activate only part of the word lines and the bit line pairs within the limit of the driving capability of the reference voltage generation circuit 104.

In addition, the sequence of selecting the word lines and activating the bit lines is not limited to the above-mentioned sequence. If the assist 1 effect and the assist 0 effect are exerted on the same number of the bit lines and the different voltages of the pair of the bit lines are written, the requirement can be satisfied. In other words, if a time period during which the timing of selecting the word lines and the timing of activating the sense amplifier circuits overlap each other is set, the timings of starting and finishing both the word lines and the sense amplifier circuits can be set freely without a specific restriction.

Furthermore, the sequence of booting the word lines WL0 to WLn and the dummy word lines DWL0, DWL1 is not limited to the above-mentioned sequence. The dummy word lines and the word lines may be booted simultaneously, or the dummy word lines may be booted prior to booting the word lines, if the timing allows the assist 1 and the assist 0 by the dummy word lines to be set.

Although the capacitance value of the dummy cells DC00 to DC1m has been described as half the capacitance of the cell capacitors (FIG. 8, (1)), the capacitance value of the dummy cells is not limited to this value. As long as the assist operation is ensured, the capacitance value can be set freely.

It is preferable that the circuit operation in the fourth embodiment is performed in each cell block. Thus, the memory cells where charge is transferred in a direction and the memory cells where charge is transferred in the opposite direction are arranged at near locations. This allows an improvement in the effect of canceling the amount of the transferred charge.

Any other methods by which the number of the memory cells C00 to Cnm into which charge is injected and the number of the cells C00 to Cnm from which charge is released become the same can suppress a potential fluctuation by canceling the amount of the charge transferred to the cell plate CP1 by capacitive coupling. For example, if data fixed at a logical high level, i.e., data 1, and data fixed at a logical low level, i.e., data 0 are written by selecting the same number of memory cells connected to the bit lines constituting the bit line pairs BL0 and /BL0 to BLm and /BLm, the number of the cell capacitors C0, C1 into which charge is injected and the number of the cell capacitors C0, C1 from which charge is released become the same, and the similar effect can be obtained.

Figure 10:
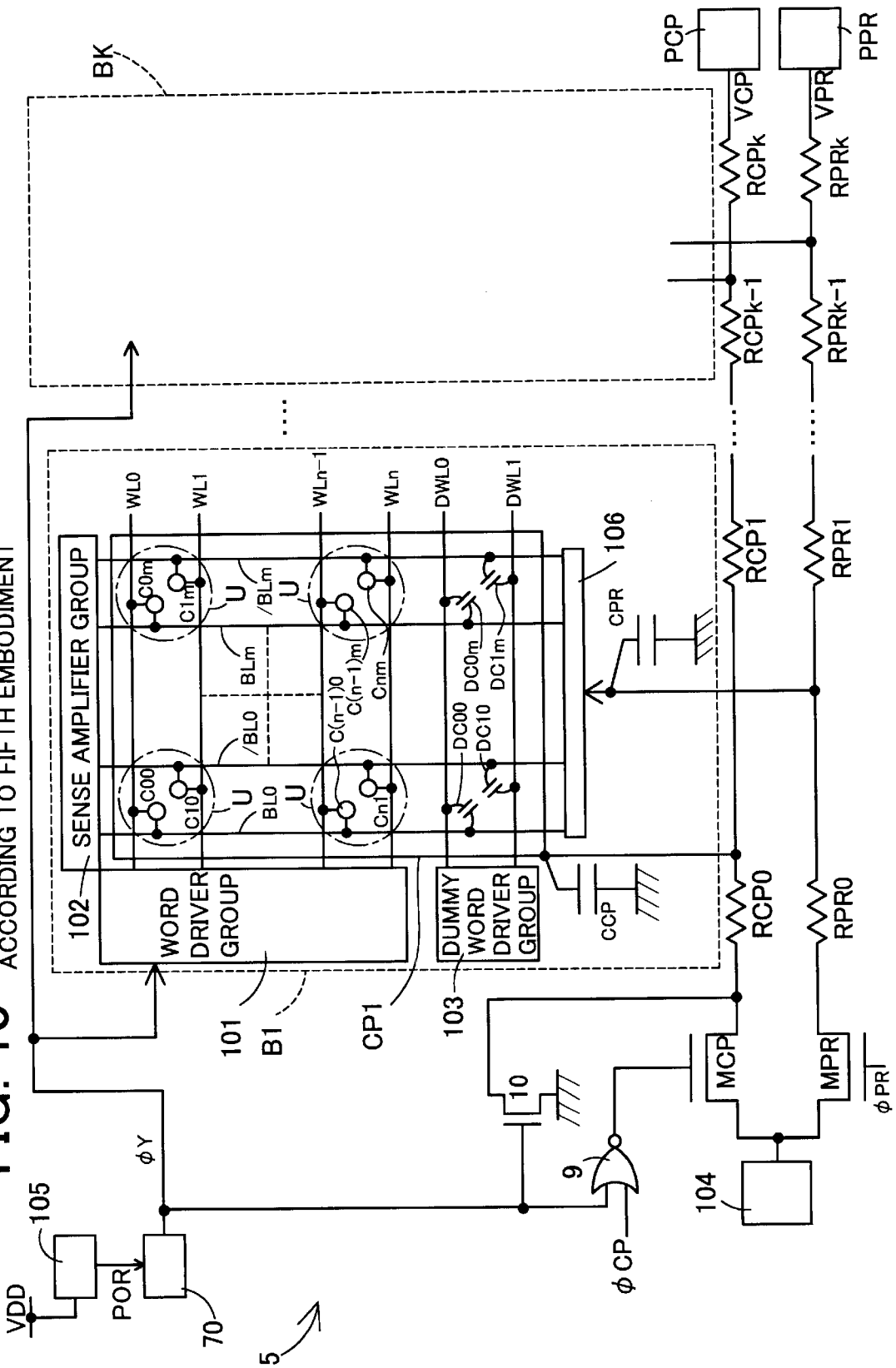
FIG. 10 is a circuit block diagram showing a semiconductor memory device according to a fifth embodiment.

A semiconductor memory device 5 (hereinafter referred to as a DRAM 5) according to a fifth embodiment of the invention shown in FIG. 10 comprises the power supply detection circuit 105 and the pulse extension circuit 70 in the DRAM 3 according to the third embodiment, in addition to the DRAM 1000 according to the conventional art (see FIG. 15). An extended pulse signal φY from the pulse extension circuit 70 is input to a word driver group 101. In addition, the extended pulse signal φY is input to the gate terminal of an NMOS transistor 10 which fixes a line VCP at a ground potential GND and a NOR gate 9. The other terminal of the NOR gate 9 receives a control signal φCP, which is input to the gate terminal of the NMOS transistor MCP in the DRAM 1000 according to the conventional art.

The extended pulse signal φY output at power-on selects all word lines WL0 to WLn through the word driver group 101. The NMOS transistor MCP is brought out of conduction to separate the line VCP from a reference voltage generation circuit 104 by fixing the output signal from the NOR gate 9 at a low level. In addition, the line VCP is fixed at the ground potential GND level by the NMOS transistor 10.

Figure 11:
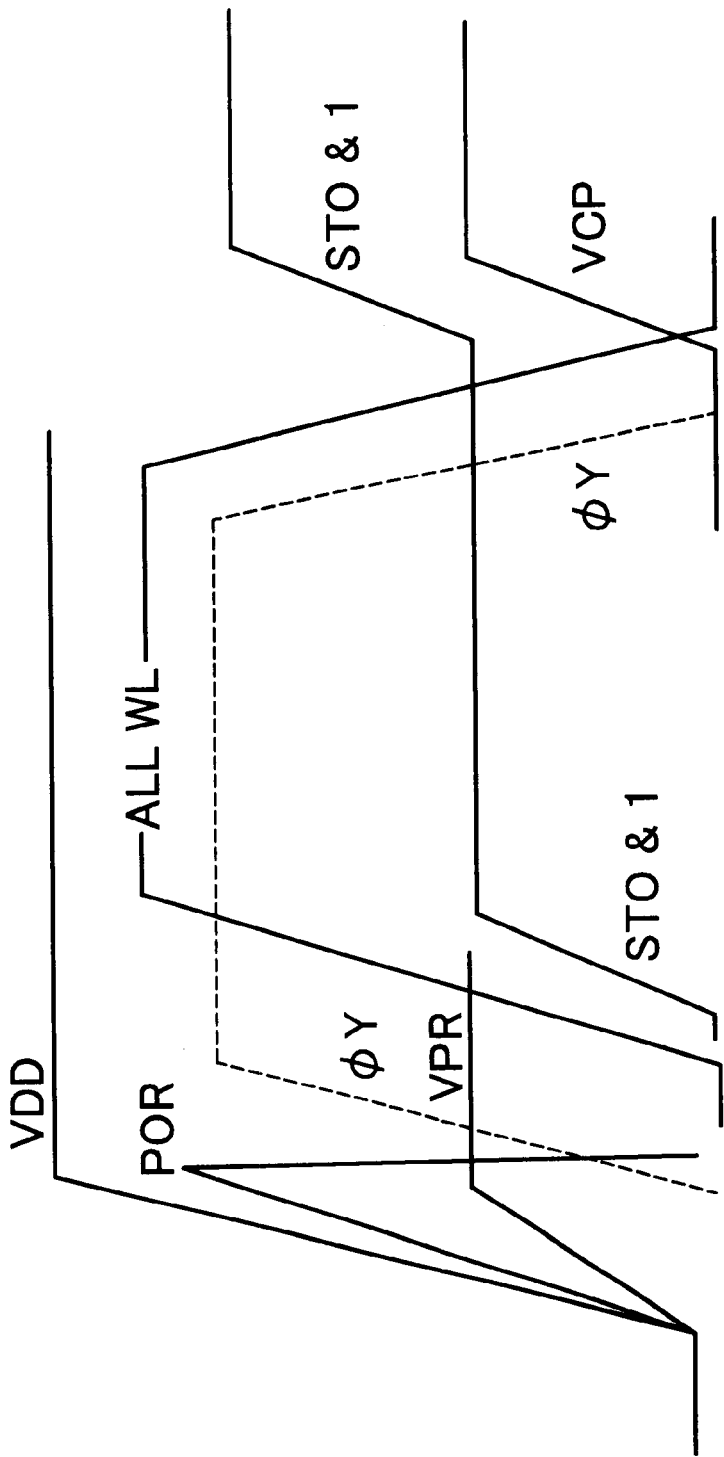
FIG. 11 is a waveform diagram showing the operation of the semiconductor memory device according to the fifth embodiment.

The circuit operation at power-on is shown in the waveform diagram of FIG. 11. In the following description, references will be made to the circuit diagram of a memory cell pair shown in FIG. 17 when necessary. In other words, when power is turned on and a power supply voltage VDD is booted, the power supply detection circuit 105 outputs a positive pulse signal POR. The pulse extension circuit 70 which receives the pulse signal POR outputs the extended pulse signal φY. Since the extended pulse signal φY fixes the line VCP at the ground potential GND level, the level of the line VCP is retained at the ground potential GND level, while the voltage level of a line VPR is increased as the power supply voltage VDD is increased. Under this condition, all word lines WL0 to WLn are selected. Bit lines BL0 to /BLm are connected with all memory cells C00 to Cnm, and the potential level of the charge storage nodes ST0, ST1 in the memory cells is increased to a reference voltage level which is the voltage level of the line VPR (for example, Viic/2).

Subsequently, the extended pulse signal φY is finished, and all word lines WL0 to WLn are closed. Then, the charge storage nodes ST0, ST1 become floating nodes which are not electrically connected to any voltage level. When the extended pulse signal φY is finished, the line VCP is freed from the ground potential GND level, and is connected to the reference voltage generation circuit 104. The voltage level of the line VCP is increased from the ground voltage GND to the reference voltage level (for example, Viic/2). At this point, charge is transferred through the cell capacitors C0, C1 by capacitive coupling to increase the potential level of the charge storage nodes ST0, ST1 by the reference voltage (for example, Viic/2). As a result, the potential level of the charge storage nodes ST0, ST1 becomes logical high level (for example, Viic), because it is the reference voltage level (for example, Viic/2) before capacitive coupling. Therefore, the state of the charge storage nodes ST0, ST1 becomes the same as the state where the data 1 is written.

In the DRAM 5 according to the fifth embodiment, all charge storage nodes ST0, ST1 are charged to the reference voltage level (for example, Viic/2) by activating all word lines WL0 to WLn as selection lines, if the line VCP as a second wiring line is fixed at the ground potential GND level as a predetermined voltage. Subsequently, when the line VCP is separated from the ground potential GND level, and the voltage of the line VCP is changed to the reference voltage as a normal voltage (for example Viic/2), the charge storage nodes can be placed in a charge storage state as a data 1 written state. The transition to this charge storage state is performed by using the capacitive coupling through the capacitive elements when the potential level of the cell plate CP1 as a reference terminal is changed from the ground potential GND as a predetermined voltage at which the line VCP is fixed, to the reference voltage as a normal voltage (for example Viic/2). Therefore, the charge transfer associated with the capacitive coupling does not induce a potential fluctuation at the cell plate CP1. Furthermore, the charge transfer is used to inject and release charge into and from the charge storage nodes, and has an effect of assisting the writing of the data 1.

Figure 12:
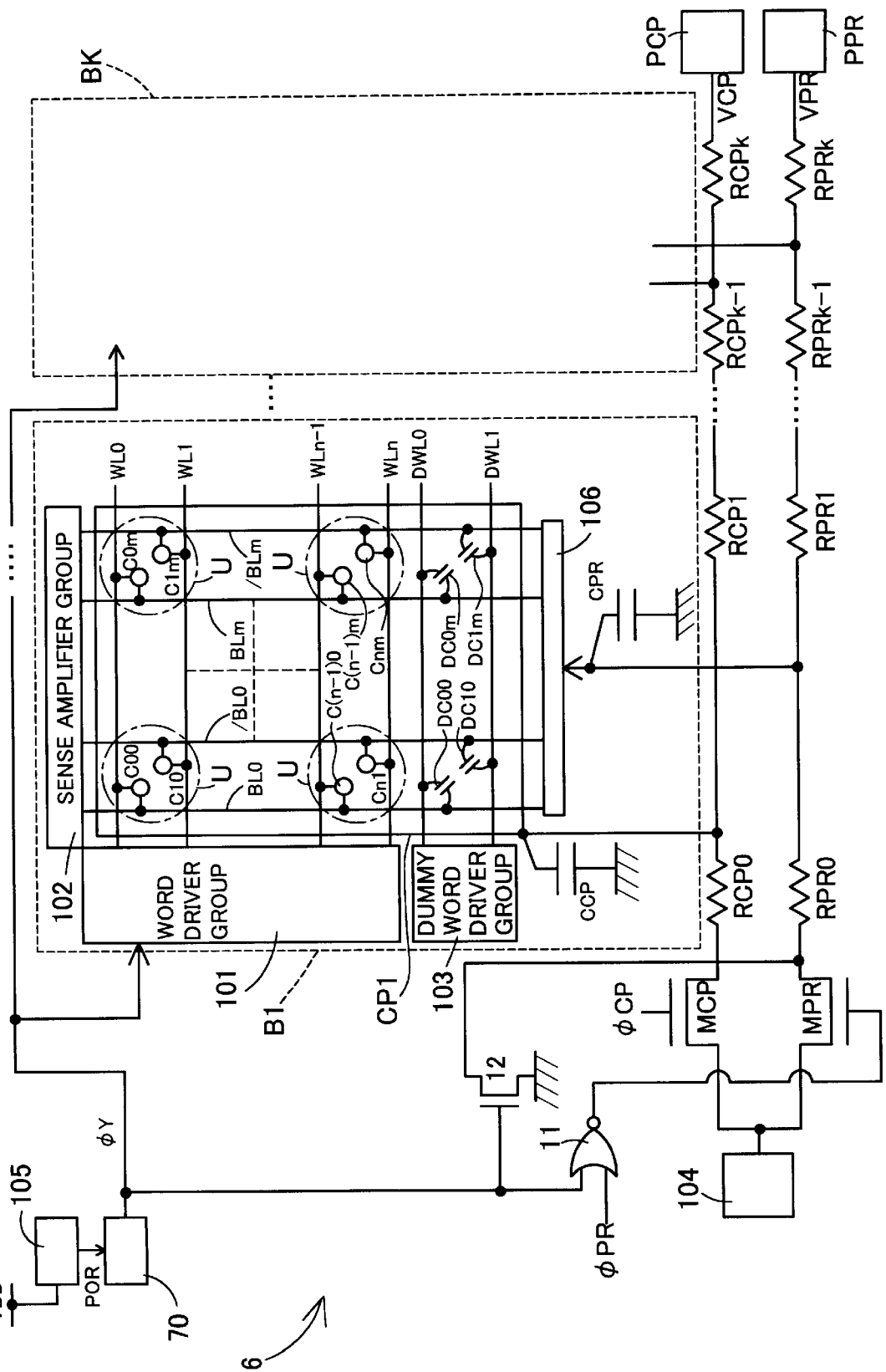
FIG. 12 is a circuit block diagram showing a semiconductor memory device according to a sixth embodiment of the invention.

A semiconductor memory device 6 (hereinafter referred to as a DRAM 6) according to a sixth embodiment of the invention shown in FIG. 12 comprises a NOR gate 11 and an NMOS transistor 12 instead of the NOR gate 9 and the NMOS transistor 10 in the DRAM 5 according to the fifth embodiment (see FIG. 10). An extended pulse signal φY is input to the NMOS transistor 12 for fixing the line VPR at the ground potential GND and to the NOR gate 11. The other terminal of the NOR gate 11 receives a control signal φPR, which is input to the gate terminal of the NMOS transistor MPR in the DRAM 1000 according to the conventional art.

The extended pulse signal φY output at power-on selects all word lines WL0 to WLn as in the DRAM 5 according to the fifth embodiment. In addition, the NMOS transistor MPR is brought out of conduction to separate the line VPR from a reference voltage generation circuit 104, and the line VPR is fixed at the ground potential GND by the NMOS transistor 12.

Figure 13:
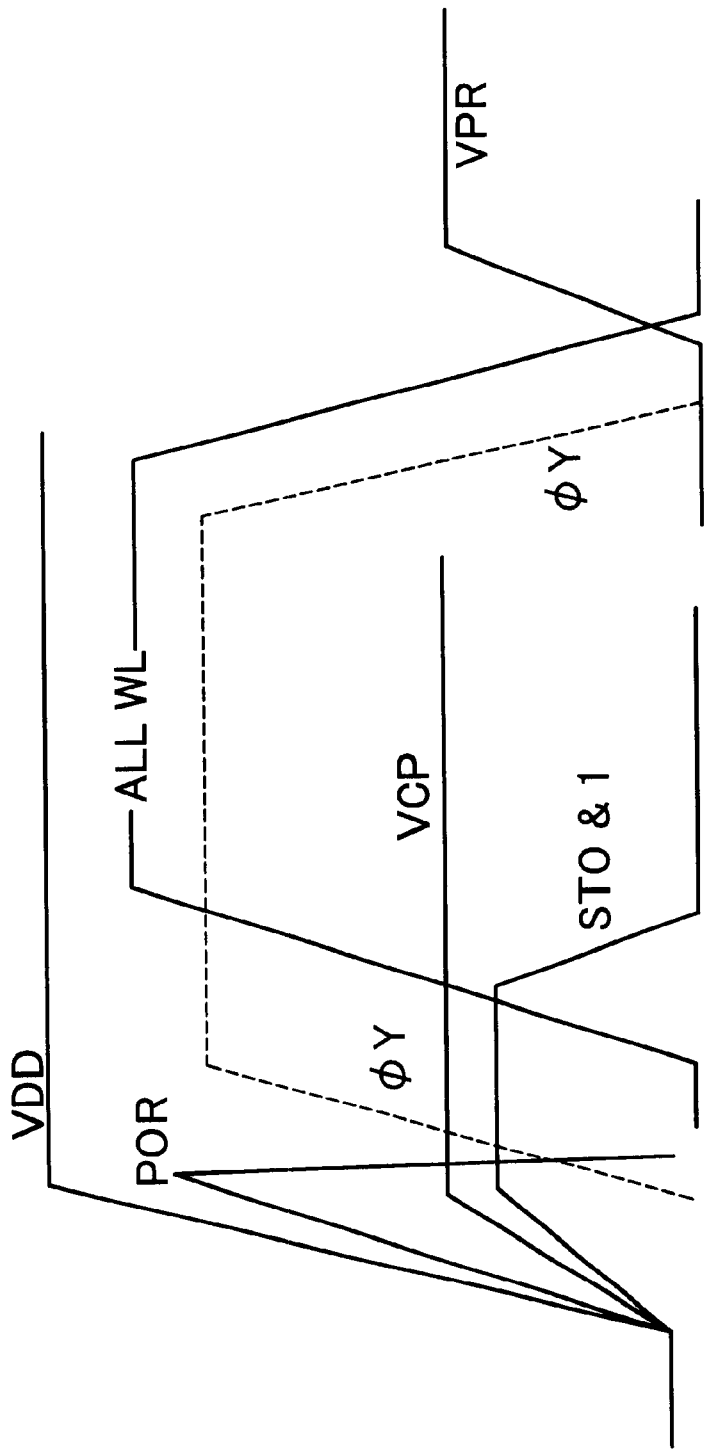
FIG. 13 is a waveform diagram showing the operation of the semiconductor memory device according to the sixth embodiment of the invention.

The circuit operation at power-on will be described based on the waveform diagram shown in FIG. 13. In the description, references will be made to the circuit diagram of a memory cell pair shown in FIG. 17 when necessary. When power is turned on and a power supply voltage VDD is booted, a power supply detection circuit 105 outputs a positive pulse signal POR. A pulse extension circuit 70 which receives the pulse signal POR outputs the extended pulse signal φY. Since the extended pulse signal φY fixes the line VPR at the ground potential GND level, the level of the line VPR is retained at the ground potential GND level, while the voltage level of a line VCP is increased as the power supply voltage VDD is increased. Under this condition, all word lines WL0 to WLn are selected. Bit lines BL0 to /BLm are connected with all memory cells C00 to Cnm, and the potential level of the charge storage nodes ST0, ST1 in the memory cells becomes the ground potential GND level which is the voltage level of the line VPR.

Subsequently, the extended pulse signal φY is finished, and all word lines WL0 to WLn are closed. Then, the charge storage nodes ST0, ST1 become floating nodes which are not electrically connected to any voltage level. When the extended pulse signal φY is finished, the line VPR is freed from the ground potential GND, and is connected to the reference voltage generation circuit 104. The voltage level of the line VPR is increased from the ground voltage GND level to the reference voltage level (for example, Viic/2).

When the potential level of the charge storage nodes ST0, ST1 is decreased to the ground potential GND level, charge is transferred through cell capacitors C0, C1 by capacitive coupling, and the potential of the cell plate CP1 is decreased. This potential is restored by supplying charge from the reference voltage generation circuit 104 through the line VCP. The cell plate CP1 can be restored before the start of a normal operation by configuring the circuit such that the cell plate CP1 is restored during a pause time between power-on and the start of a normal operation.

In the DRAM 6 according to the sixth embodiment, all charge storage nodes ST0, ST1 can be placed in a charge storage state as a data 0 written state only by activating all word lines WL0 to WLn, if the line VPR is fixed at the ground potential GND. The transition to this state does not require performing a differential amplification operation using each sense amplifier circuit or other operations. In addition, all word lines can be activated in one cycle, and the transition operation can be performed in a short time. When the data 0 is written in the charge storage nodes ST0, ST1, the potential of the cell plate CP1 is decreased due to capacitive coupling. However, this potential is restored by supplying charge from the reference voltage generation circuit 104 through the line VCP. The cell plate CP1 can be restored before the start of a normal operation by configuring the circuit such that the cell plate CP1 is restored during a pause time between power-on and the start of a normal operation.

The voltage level of the selected word lines WL0 to WLn does not need to be the voltage value under a normal operating condition. Since the voltage written in the memory cells C00 to Cnm through the bit lines BL0 to /BLm is the reference voltage (for example, Viic/2) or the ground potential GND, no problem arises if a voltage exceeding the threshold voltage of NMOS transistors M0, M1 as transfer gates can be applied.

In addition, if all word lines WL0 to WLn are selected, data can be written in all memory cells C00 to Cnm in one cycle, and a potential fluctuation at the cell plate CP1 due to a subsequent access operation does not occur. However, the potential fluctuation at the cell plate CP1 is a phenomenon depending on the balance between the driving capability of the reference voltage generation circuit 104 and capacitive coupling. Therefore, if the reference voltage generation circuit 104 permits, it is not necessary to write data in all memory cells. It is also possible to activate only part of the word lines within the limit of the driving capability of the reference voltage generation circuit 104.

In the description of the fifth and the sixth embodiments, there have been exemplarily shown the cases where the NMOS transistor 10 or the NMOS transistor 12 is used to fix the line VCP or the line VPR at the ground potential GND. However, a PMOS transistor may be used instead of the NMOS transistor to fix the line at a logical high level voltage (for example, Viic). In this case, the data 0 is written in the memory cells in the fifth embodiment, and the data 1 is written in the memory cells in the sixth embodiment.

In the fifth and the sixth embodiments, it is not necessary to perform a differential amplification operation using sense amplifier circuits or other operations. All word lines WL0 to WLn can be activated in one cycle, and the data writing can be completed in a short time. To perform the operation of activating the word lines, existing circuits can be effectively used, and moreover circuits such as a test circuit can be used as they are.

Furthermore, the fifth embodiment and the sixth embodiment may be merged. In other words, it is possible to make a configuration in which the line VCP and the line VPR are both fixed at certain potential levels.

In the case where the line VCP and the line VPR are both fixed at the ground potential GND, the data 0 is written in the charge storage nodes ST0, ST1 by selecting the word lines WL0 to WLn. If the line VCP is separated from the ground potential GND under this condition, the potential level of the cell plate CP1 is increased from the ground potential GND to the reference voltage (for example, Viic/2). However, since the charge storage nodes are fixed at the ground potential GND through the bit lines BL0 to /BLm, a potential fluctuation due to capacitive coupling does not occur at the charge storage nodes. After the word lines are deselected, the line VPR is separated from the ground potential GND, and the voltage level of the bit lines is increased to the reference voltage level (for example, Viic/2). Under this condition, the writing of the data 0 in all memory cells is completed.

In the case where the line VCP is fixed at the ground potential GND and the line VPR is fixed at a logical high level (for example, Viic), the data 1 is written in the charge storage nodes ST0, ST1 by selecting the word lines WL0 to WLn. When the line VCP is separated from the ground potential GND under this condition, the potential level of the cell plate CP1 is increased from the ground potential GND to the reference voltage level (for example, Viic/2). However, since the charge storage nodes are fixed at the logical high level (for example, Viic) through the bit lines, a potential fluctuation due to capacitive coupling does not occur at the charge storage nodes. After the word lines are deselected, the line VPR is separated from the logical high level, and the voltage level of the bit lines is decreased to the reference voltage level (for example, Viic/2). Under this condition, the writing of the data 1 in all memory cells is completed.

Figure 14:
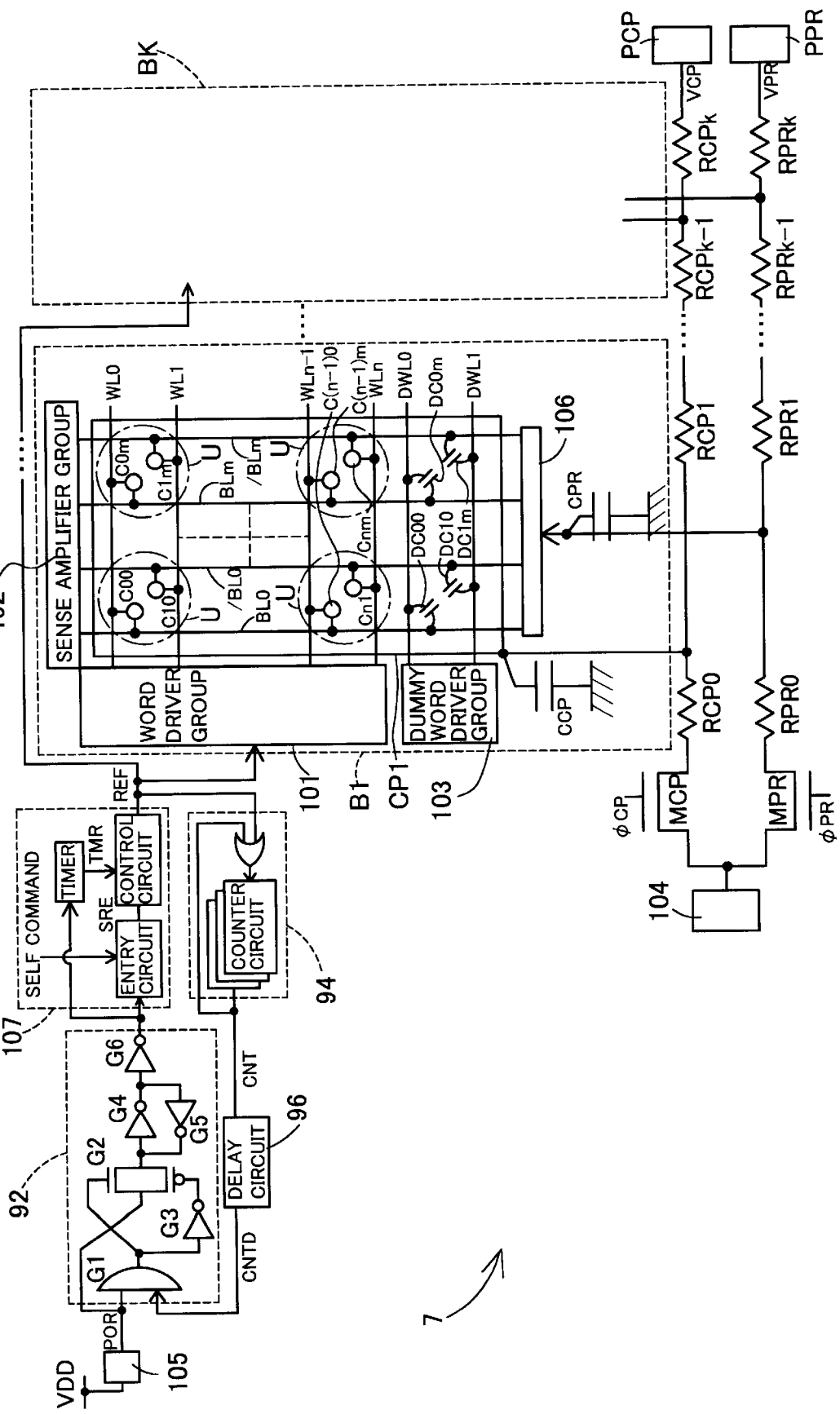
FIG. 14 is a circuit block diagram showing a semiconductor memory device according to a seventh embodiment of the invention.

A semiconductor memory device 7 (hereinafter referred to as a DRAM 7) according to a seventh embodiment of the invention shown in FIG. 14 comprises a refresh control circuit 107 under a normal operating condition of the DRAM 1000 according to the conventional art (see FIG. 15), a refresh trigger circuit 92, a counter circuit 94, a delay circuit 96, and a power supply detection circuit 105 for detecting the input of a power supply voltage.

The refresh control circuit 107 controls a self-refresh operation in the DRAM 1000. When an Entry circuit receives a Self command from a control circuit (not illustrated), the Entry circuit outputs a signal SRE. A timer for measuring the time interval between the signal SRE and the refresh operation outputs a signal TMR, and whereby a Control circuit outputs a refresh control signal REF. Based on the refresh control signal REF, a word driver group 101 sequentially selects each word line to perform a self-refresh operation.

In the DRAM 7 according to the seventh embodiment, the refresh control circuit 107 is used. A pulse output signal POR from the power supply detection circuit 105 is input to a NAND gate G1 in an input stage of the refresh trigger circuit 92. An output signal CNTD from the delay circuit 96 is input to the other input terminal of the NAND gate GI. When both signals (with a logical high level) input to the NAND gate G1 are selected, an output signal from the refresh trigger circuit 92 starts the Entry circuit of the refresh control circuit 107. In addition, the output signal from the refresh trigger circuit 92 is input to the timer and shortens the refresh cycle. The self-refresh operation is started at a cycle shorter than the original cycle. Each refresh operation is counted by the counter circuit 94 which detects the signal REF. When the counted value reaches a prescribed number of times, the counter circuit 94 outputs an output signal CNT. The output signal CNT is returned to the refresh trigger circuit 92 as a signal CNTD through the delay circuit 96. Since the signal CNTD has a logical low level, the refresh trigger circuit 92 does not output a trigger signal any more, and the preset cycle at power-on is finished.

Bit line pairs BL0 and /BL0 to BLm and /BLm are restored by sense amplifier circuits by the refresh operation, while word lines WL0 to WLn are sequentially selected.

Since this operation is performed following power-on, no data exists in memory cells C00 to Cnm at this point. In other words, charge storage nodes ST0, ST1 are retained at a potential level slightly lower than a reference voltage (for example, Viic/2) due to the capacitive coupling associated with an increase in the potential of the cell plate CP1. Then, the word lines are selected, and the charge storage nodes are connected to the bit lines and are restored. This restoration is performed in the direction decided by uncertain factors such as a difference in the potentials at which the bit lines of each bit line pair are retained, a difference in sensitivity of the sense amplifier circuits, and disturbance at the time of differential amplification. Therefore, either the data 1 or the data 0 is written in each memory cell, and charge is either injected into or released from the charge storage nodes. Accordingly, the data writing is performed in all memory cells, and a potential fluctuation does not occur at the cell plate.

In the DRAM 7 according to the seventh embodiment, a predetermined number of memory cells C00 to Cnm perform a refresh operation due to a self-refresh operation by the refresh control circuit 107. Accordingly, each cell plate CP1 can be placed in a charge storage state as a data written state.

Then, the refresh trigger circuit 92 receives the signal POR output at power-on, and starts its operation. In addition, the refresh trigger circuit 92 acts on the timer for deciding the refresh cycle in the refresh control circuit 107 to shorten the measurement time, thereby allowing the operating time at power-on to be shortened. Thus, the measurement time of the timer can be appropriately adjusted such that these operations are performed during a pause time between power-on and the start of a normal operation.

When the data writing is performed in the charge storage nodes ST0, ST1, the potential of the cell plate CP1 is decreased by capacitive coupling. However, this potential is restored by supplying charge from the reference voltage generation circuit 104 through the line VCP. The potential of the cell plate CP1 can be restored before the start of a normal operation by configuring the circuit such that the potential of the cell plate CP1 is restored during a pause time between power-on and the start of a normal operation.

The counter circuit 94 and the delay circuit 96 are not indispensable circuits. Even if these circuits do not exist, it is possible to perform the data writing in the predetermined memory cells C00 to Cnm, and to inhibit this operation thereafter, provided that the internal timing is adjusted.

If all word lines WL0 to WLn are selected, the data can be written in all memory cells C00 to Cnm. Therefore, a potential fluctuation due to a subsequent operation does not occur at the cell plate CP1. However, the potential fluctuation at the cell plate CP1 is a phenomenon depending on the balance between the driving capability of the reference voltage generation circuit 104 and capacitive coupling. Therefore, if the reference voltage generation circuit 104 permits, it is not necessary to write the data in all memory cells. It is also possible to activate only part of the word lines and the bit line pairs within the limit of the driving capability of the reference voltage generation circuit 104.

Needless to say, the invention is not limited to the above-mentioned embodiments, and various improvements and modifications can be made without departing from the true spirit of the invention.

For example, although the DRAM is used as an example in the description of the embodiments, the invention is not limited to the DRAM. The invention may be applied to any semiconductor memory device configured such that data is stored by storing charge in capacitive elements, such as a synchronous DRAM.

According to the invention, it is possible to provide a semiconductor memory device for storing data by storing charge, comprising cell capacitors for storing charge in memory cells, wherein a cell plate potential is not fluctuated even when the device state is changed from a state in which no stored charge, or if any, very little stored charge exists in all charge storage nodes of the cell capacitors at power-on to an access operation state.

What is claimed is:

1. A semiconductor memory device, comprising:
    a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements;
    potential fluctuation suppression capacitive elements connected to the reference terminal, for suppressing a potential fluctuation associated with the charge injected from each of the capacitive elements by capacitive coupling when the charge is injected into or released from the second terminal of each of the capacitive elements;
    capacitive connection switch elements for connecting the reference terminal with the potential fluctuation suppression capacitive elements; and
    a power supply detection circuit for detecting the input of a power supply voltage,
    wherein the capacitive connection switch elements are brought into conduction to electrically connect the reference terminal with the potential fluctuation suppression capacitive elements during a predetermined time period after the detection by the power supply detection circuit.

2. The semiconductor memory device according to claim 1, further comprising:
    a plurality of cell blocks, each of the cell blocks including a predetermined number of storage cells among the plurality of storage cells as a unit, wherein
        the potential fluctuation suppression capacitive element is arranged in each of the cell blocks.

3. The semiconductor memory device according to claim 2, further comprising:
    a storage cell area in which the cell blocks are arranged; and
    a peripheral circuit area in which various control circuits are arranged, wherein
        the potential fluctuation suppression capacitive elements are arranged in the storage cell area.

4. The semiconductor memory device according to claim 1, further comprising:
    a plurality of cell blocks, each of the cell blocks including a predetermined number of storage cells among the plurality of storage cells as a unit, wherein
        at least either the potential fluctuation suppression capacitive element or the capacitive connection switch element is arranged in each of the cell blocks.

5. The semiconductor memory device according to claim 4, further comprising:
    a storage cell area in which the cell blocks are arranged; and a peripheral circuit area in which various control circuits are arranged, wherein at least either the potential fluctuation suppression capacitive elements or the capacitive connection switch elements are arranged in the storage cell area.

6. The semiconductor memory device according to claim 1, wherein the power supply detection circuit is a power-on reset circuit, and a predetermined time period after the detection by the power supply detection circuit is the duration of an output signal from the power-on reset circuit, or a pulse signal having a predetermined pulse width generated based on the output signal.

7. A semiconductor memory device, comprising:

a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements;

a reference voltage generation portion for generating a reference voltage value signal to be supplied to the reference terminal; and a plurality of reference voltage drive portions arranged in each group of a predetermined number of storage cells of the plurality of storage cells, for receiving the reference voltage value signal and supplying a reference voltage to the reference terminal corresponding to each group of the predetermined number of storage cells.

8. The semiconductor memory device according to claim 7, further comprising:

a plurality of cell blocks, each of the cell blocks including a predetermined number of storage cells among the plurality of storage cells as a unit, wherein the reference voltage drive portions are arranged in each of the cell blocks.

9. The semiconductor memory device according to claim 8, further comprising:

a storage cell area in which the cell blocks are arranged; and a peripheral circuit area in which various control circuits are arranged, wherein the reference voltage drive portions are arranged in the storage cell area.

10. A semiconductor memory device, comprising:

a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements;

a plurality of data lines provided in each group of a predetermined number of the storage cells as paths for injecting and releasing charge into and from the second terminal of each of the capacitive elements;

a first wiring line for supplying a reference voltage to each of the data lines;

a second wiring line for supplying a reference voltage to the reference terminal;

a clamp switch element provided between the first wiring line or the second wiring line and a predetermined voltage;

a plurality of selection lines for electrically connecting each of the data lines with the second terminal of each of the capacitive elements; and a power supply detection circuit for detecting the input of a power supply voltage, wherein based on a signal from the power supply detection circuit, the first or the second wiring line is fixed at the predetermined voltage by controlling the clamp switch element, a predetermined number of the selection lines are selected, the second terminal of each of the capacitive elements is set at a preset voltage, furthermore, the predetermined number of the selection lines are deselected, the predetermined voltage is subsequently separated from the first wiring line or the second wiring line by controlling the clamp switch element, and the reference voltage is supplied.

11. The semiconductor memory device according to claim 10, wherein the predetermined voltage is a high level voltage or a low level voltage at the second terminals of the capacitive elements, the reference voltage is an arithmetic average of the high level voltage and the low level voltage, the preset voltage is the predetermined voltage and the second terminal of each of the capacitive elements is retained at the preset voltage even after the predetermined number of the selection lines are deselected in the case where the first wiring line is fixed at the predetermined voltage, and the preset voltage becomes the reference voltage and the voltage of the second terminal of each of the capacitive elements becomes a voltage opposite to the predetermined voltage by the capacitive coupling with the reference terminal when the voltage of the second wiring line becomes the reference voltage after the predetermined number of the selection lines are deselected in the case where the second wiring line is fixed at the predetermined voltage.

12. The semiconductor memory device according to claim 10, wherein a circuit for selecting a predetermined number of the selection lines based on a signal from the power supply detection circuit is a control circuit for the selection lines for activating a predetermined number of the selection lines based on a test signal at the time of test.

13. The semiconductor memory device according to claim 10, wherein the power supply detection circuit is a power-on reset circuit, and an output signal from the power supply detection circuit is an output signal from the power-on reset circuit, or a pulse signal having a predetermined pulse width generated based on the output signal.

14. A semiconductor memory device, comprising:

a plurality of storage cells for storing data by storing charge in capacitive elements, a first terminal of each of the capacitive elements in the plurality of storage cells being connected to a common reference terminal, and the charge being stored by being injected into and released from a second terminal of each of the capacitive elements;

a plurality of data lines provided in each group of a predetermined number of the storage cells as paths for injecting and releasing charge into and from the second terminal of each of the capacitive elements;

a first wiring line for supplying a reference voltage to each of the data lines;

a second wiring line for supplying a reference voltage to the reference terminal;

a first clamp switch element and a second clamp switch element provided between the first wiring line and the second wiring line, and a predetermined voltage;

a plurality of selection lines for electrically connecting each of the data lines with the second terminal of each of the capacitive elements; and a power supply detection circuit for detecting the input of a power supply voltage, wherein based on a signal from the power supply detection circuit, the first and the second wiring line are fixed at the predetermined voltage by controlling the first clamp switch element and the second clamp switch element a predetermined number of the selection lines are selected, the second terminal of each of the capacitive elements is set at a preset voltage, the predetermined voltage is separated from the second wiring line by controlling the second clamp switch element, and the reference voltage is supplied, furthermore the predetermined number of the selection lines are deselected, the predetermined voltage is subsequently separated from the first wiring line by controlling the first clamp switch element, and the reference voltage is supplied.

15. The semiconductor memory device according to claim 14, wherein the predetermined voltage is a high level voltage or a low level voltage at the storage cells with regard to the first wiring line, and the low level voltage with regard to the second wiring line, the reference voltage is an arithmetic average of the high level voltage and the low level voltage, the preset voltage is the predetermined voltage, and the second terminal of each of the capacitive elements is retained at the preset voltage even after the predetermined number of the selection lines are deselected.

16. The semiconductor memory device according to claim 14, wherein a circuit for selecting a predetermined number of the selection lines based on a signal from the power supply detection circuit is a control circuit for the selection lines for activating a predetermined number of the selection lines based on a test signal at the time of test.

17. The semiconductor memory device according to claim 14, wherein the power supply detection circuit is a power-on reset circuit, and an output signal from the power supply detection circuit is an output signal from the power-on reset circuit, or a pulse signal having a predetermined pulse width generated based on the output signal.

18. A control method of a semiconductor memory device comprising a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements, wherein during a predetermined time period timed by a predetermined width of pulse signal generated in accordance with detection of power voltage being supplied, potential fluctuation suppression capacitive elements are connected to the reference terminal in order to suppress a potential fluctuation associated with the charge injected from each of the capacitive elements by capacitive coupling when the charge is injected into and released from the second terminal of each of the capacitive elements.

19. The control method of the semiconductor memory device according to claim 18, wherein the operations in the control method are performed during a predetermined time period after the input of the power supply voltage.

20. A control method of a semiconductor memory device comprising a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements; a plurality of data lines provided in each group of a predetermined number of the storage cells as paths for injecting and releasing charge into and from the second terminal of each of the capacitive elements; a first wiring line for supplying a reference voltage to each of the data lines; a second wiring line for supplying a reference voltage to the reference terminal; and a plurality of selection lines for electrically connecting each of the data lines with the second terminal of each of the capacitive elements, wherein the input of a power supply voltage is detected, the first wiring line or the second wiring line is fixed at the predetermined voltage, a predetermined number of the selection lines are selected, the second terminal of each of capacitive elements is set at a preset voltage, and then a predetermined number of the selection lines are deselected, the predetermined potential is separated from the first or the second wiring line, and the reference voltage is supplied.

21. The control method of the semiconductor memory device according to claim 20, wherein the predetermined voltage is a high level voltage or a low level voltage at the second terminals of the capacitive elements, the reference voltage is an arithmetic average of the high level voltage and the low level voltage, and the preset voltage is the predetermined voltage and the second terminal of each of the capacitive elements is retained at the preset voltage even after the predetermined number of the selection lines are deselected, in the case where the first wiring line is fixed at the predetermined voltage, and the preset voltage becomes the reference voltage and the voltage of the second terminal of each of the capacitive elements becomes a voltage opposite to the predetermined voltage by the capacitive coupling with the reference terminal when the voltage of the second wiring line becomes the reference voltage after the predetermined number of the selection lines are deselected, in the case where the second wiring line is fixed at the predetermined voltage.

22. The control method of the semiconductor memory device according to claim 20, wherein the operations in the control method are performed during a predetermined time period after the input of the power supply voltage.

23. A semiconductor memory device, comprising:

a plurality of storage cells for storing data by storing charge in capacitive elements with a first terminal of each of the capacitive elements in the plurality of storage cells being connected to a common reference terminal, and the charge being stored by being injected into and released from a second terminal of each of the capacitive elements;

a plurality of data lines provided in each group of a predetermined number of the storage cells as paths for injecting and releasing charge into and from the second terminal of each of the capacitive elements;

a first wiring line for supplying a reference voltage to each of the data lines; a second wiring line for supplying a reference voltage to the reference terminal;

wiring line connection switch elements for connecting the first wiring line with the second wiring line; and a power supply detection circuit for the input of a power supply voltage, wherein the wiring line connection switch elements are brought into conduction to electrically connect the first wiring line with the second wiring line during a predetermined time period timed by a predetermined width of pulse signal generated in accordance with the detection by the power supply detection circuit.

24. The semiconductor memory device according to claim 23, further comprising:

a plurality of cell blocks, each of the cell blocks including a predetermined number of storage cells among the plurality of storage cells as a unit, wherein at least one of the wiring line connection switch element is arranged in each of the cell blocks.

25. The semiconductor memory device according to claim 24, further comprising:

a storage cell area in which the cell blocks are arranged; and a peripheral circuit area in which various control circuits are arranged, wherein at least either the potential fluctuation suppression capacitive elements or the wiring line connection switch elements are arranged in the storage cell area.

26. The semiconductor memory device according to claim 23, wherein the power supply detection circuit is a power-on reset circuit, and a predetermined time period after the detection by the power supply detection circuit is the duration of an output signal from the power-on reset circuit, or a pulse signal having a predetermined pulse width generated based on the output signal.

27. A control method of a semiconductor memory device comprising a plurality of storage cells for storing data by storing charge in capacitive elements, with a first terminal of each of the capacitive elements in the plurality of storage cells being connected to a common reference terminal, and the charge being stored by being injected into and released from a second terminal of each of the capacitive elements, wherein during a predetermined time period timed by a predetermined width of pulse signal generated in accordance with detection of power voltage being supplied, a first wiring line for supplying a reference voltage to a plurality of data lines provided in each group of a predetermined number of the storage cells is connected with a second wiring line for supplying the reference voltage to the reference terminal.

28. The control method of the semiconductor memory device according to claim 27 wherein the operations in the control method are performed during a predetermined time period after the input of the power supply voltage.

* * * * *